United States Patent [19]

Grudkowski et al.

[11] Patent Number: 5,107,310
[45] Date of Patent: Apr. 21, 1992

[54] ACT DEVICE WITH BUFFER CHANNEL

[75] Inventors: Thomas W. Grudkowski, Glastonbury; Eric W. Petraske, Canton, both of Conn.

[73] Assignee: United Technologies Corporation, Hartford, Conn.

[21] Appl. No.: 661,268

[22] Filed: Feb. 22, 1991

[51] Int. Cl.⁵ .................................. H01L 29/161
[52] U.S. Cl. ............................ 357/16; 357/26; 357/25; 357/23.12; 324/523; 324/527; 377/60
[58] Field of Search .............. 357/25, 26, 16, 23.12, 357/24, 24 LR, 24 M, 4; 324/523, 527; 377/59, 60, 61, 62, 63

[56] References Cited

U.S. PATENT DOCUMENTS

| | | | |
|---|---|---|---|
| 4,491,811 | 1/1985 | Miitsuma et al. | 357/26 X |
| 4,799,244 | 1/1989 | Mikoshiba et al. | 357/24 X |
| 4,893,161 | 1/1990 | Tanski et al. | 357/16 X |

OTHER PUBLICATIONS

Hurlburt et al, "An Acoustoelectric Schohky-Diode Memory-Correlator Subsystem", IEEE 1978 Ultrasonics Symposium Proceedings, IEEE Cat, #78 CH1344-ISU, Cherry Hill, N.J., U.S.A., Sep. 25-27, 1978, pp. 33-37.
Hickernell et al, "Monolithic Surface Wave Transversal Filter," IEEE 1977 Ultrasonics Symposium Proceedings, IEEE Cat. #77CH1264-ISO, Phoenix, Ariz., USA, Oct. 26-28, 1977.
Hoskins et al, "Charge Transport by Surface Acoustic Waves in GaAs", *Appl. Phys. Lett.*, 41(4), 15 Aug. 1982, pp. 332-334.

*Primary Examiner*—William Mintel

[57] ABSTRACT

A device having at least two channels for holding electron packets receives serial data in a first channel. A blocking potential is applied to a set of electrodes to store a set of charge packets with the device. Packets are transferred to the other channel, manipulated and released to travel to an output port. Manipulation operations include arithmetic operations, logic operations, multiplexing and demultiplexing.

102 Claims, 7 Drawing Sheets

ACT DEVICE WITH BUFFER CHANNEL

DESCRIPTION

1. Cross Reference to Related Applications

This application is related to the subject matter disclosed and claimed in copending U.S. Ser. No. (Attorney 07/658,825 Docket R-3350n) entitled Acoustic Charge Transport Memory Device Thomas W. Grudkowski and U.S. Ser. No. (Attorney 07/658,824 Docket R-3454n) entitled Phase Shift Control of Parallel SAW Units by Thomas W. Grudkowski filed on even date herewith and assigned to the same assignee herein incorporated by reference.

2. Technical Field

The field of the invention is that of signal processing with surface acoustic wave devices capable of transporting electronic charge, referred to as ACT (acoustic charge transport) devices, and HACT, an improved ACT having a heterostructure in the semiconductor layer used for charge transport.

3. Background Art

It is known to sample a signal by feeding the signal into the input of a GaAs (or other suitable piezoelectric semiconductor) ACT or a (GaAs/Al)GaAs (or other suitable heterostructure) HACT device which injects electrons into a semiconductor layer where they are carried along from an input electrode towards an output electrode by a surface acoustic wave (SAW). For convenience, the term ACT will be taken to include both ACTs and HACTs. Conventional ACT processing uses tap electrodes positioned between the input and the output electrodes to sample the signal as it passes along the device. It is also known that an ACT/HACT memory structure can be used to impose a uniform blocking potential on the tapping electrodes, so that the attractive force of the potential captures the charge packets and prevents them from being carried by the SAW. When the potential is released, after a variable delay period, the charge packets are carried along by the SAW and are read out at the output electrode at the same rate at which they are entered. These prior art devices simply pass out the stored charge packets without alteration or enhancement of the information that they carry. In addition, conventional ACT/HACT memory device operation results in a uniform delay for all of the stored samples of the input waveform.

DISCLOSURE OF INVENTION

The invention is directed at an improved ACT/HACT memory device in which a serial signal is sampled by the process of electron injection into a device; is stored by the imposition of a blocking potential at a predetermined time; is then shifted to a parallel channel and manipulated. The signal is read out serially.

A feature of the invention is the provision of analog operations on the stored charge, such as addition, subtraction, multiplication, and division.

Another feature of the invention is the provision of logic operations, such as AND and OR.

Other features and advantages will be apparent from the specification and claims and from the accompanying drawings which illustrate an embodiment of the invention.

BEST MODE FOR CARRYING OUT THE INVENTION

Figure 1:
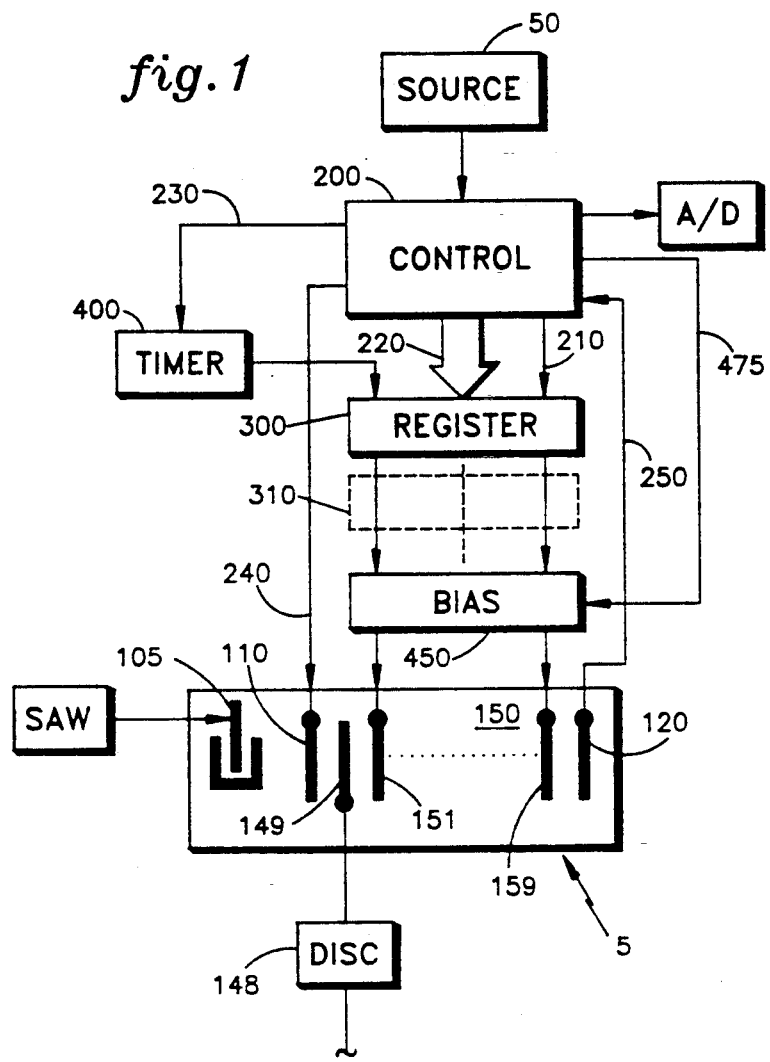
FIG. 1 illustrates in partially pictorial, partially schematic form, a HACT signal processing system.

Referring now to FIG. 1, there is shown a FIFO (first in first out) memory constructed from an ACT/HACT device 100 in a top view having an input electrode 110 and an output electrode 120. ACT/HACT device 10 may be constructed as described in U.S. Pat. 4,893,161 or other conventional ACT or HACT geometry embodiments. A SAW signal is generated by transducer 105 controlled by a SAW frequency generator 90. A data signal comes from a source 50 through a controller 200, then along line 240 into the input electrode 110 of the device. This signal is sampled by the SAW waveform as it passes beneath electrode 110, so that electron packets are injected into the charge transport channel. Conventionally, the device is operated with a background current flowing into the SAW channel, so that a "zero" signal will be represented by a finite amount of charge. This is the same as having an offset added to the signal that is subtracted off to get the true value of the data whenever it is convenient.

When enough time has passed so that the SAW wave has carried the sampled signals past a series of tap electrodes, labeled 151 for the first one 159 for the last one and collectively referred to by the numeral 150, a blocking voltage of conventional magnitude (which is usually less than several volts, but greater than the SAW potential of approximately $\leq 1$ volt) is applied to electrodes 150 by switching device 300, which in this embodiment is a shift register that will be described below. A potential is applied to each of tap electrodes 150 by bias circuit 450 sufficient to trap and hold the charge packet then underneath it. The stored signal may cover only a portion of the tap electrodes and need not have a long enough duration to extend the entire length of array 150. The sampled waveform is thus stored for as long as the blocking potential is present, and consistent with the charge storage time in the semiconductor (typically between 100–1000 $\mu$sec). The SAW is preferably continuous throughout the storage process, so that it need not be restarted when the charge packets are released.

When the blocking potential is released on one or more electrodes, the SAW will carry the corresponding charge packet(s) to output electrode 120. A signal corresponding to the magnitude of the sampled input signal then appears on electrode 120 for further processing as desired.

Shift register 300, connected to tap electrodes 150, has a number of cells 351–359, one cell corresponding to each of tap electrodes 150. It includes conventional serial or parallel load, parallel unload hardware. Shift register 300 and the associated loading hardware will be referred to collectively as the charge storage control means.

Controller 200 sends signals along line 230 to timer 400 which, in turn, sends signals to shift register 300. The control signals going into shift register 300 come from controller 200 along line 210. Signals may also be sent on a bus indicated by the arrow labeled 220 to shift register 300 in a parallel load fashion. The convention will be used here with respect to the trapping electrodes that a logic 1 signal represents the voltage required to trap a charge packet and a logic 0 signal is the absence of that voltage. The magnitude of the voltage will depend on the particular geometry and electrical characteristics of the ACT/HACT device in question and is readily determined by those skilled in the art. When it is desired to store the data signal carried by the SAW, timer 400 will send a signal to register 300, which will pass out a uniform logic 1 to each of tap electrodes 150. Those skilled in the art will readily appreciate that electrodes 150 may be in constant electrical contact with the cells of register 300, may be gated to respond to the cell data only when the gate is open, etc. All these variations are included in the term charge storage control means. Those skilled in the art will readily appreciate that timer 400 may be part of controller 200 and one or the other may be implemented in a general or special purpose digital computer or a finite state machine implemented in a standard cell circuit, a gate array or any other convenient system.

When it is desired to read out the stored signal, zeros will be shifted into shift register 300 along line 210, either in parallel or one by one. After the first zero is shifted into cell 359, corresponding to tap electrode 159, the tap electrodes are exposed to the new configuration with the blocking potential being on all but one of the electrodes. The last charge packet, under electrode 159, is now free to move and will be carried by the SAW to output electrode 120 from which a signal will travel along line 250 into controller 200 and out into analog to digital converter 500. Output electrode 120 may be ohmic or it may be a nondestructive electrode such as a Schottky, in which case there will be a drain electrode to collect the charge.

At the next stage, after a delay that is set to accommodate the next processing unit connected to output electrode 120, another zero has been shifted into register 300 and both the packets beneath electrode 159 and the next one to its left are now free. The next charge packet in sequence is released from the next electrode, passes under electrode 159 and on out to the output electrode 120. This process continues until all the charge packets have been released, with whatever spacing or time interval that is desired between them. Conventionally, this time interval will be uniform, but it does not need to be.

The implementation of this method of releasing samples will be evident to those skilled in the art. For example, a bias network shown schematically in FIG. 1 as box 450 will maintain the tap electrodes at the blocking potential unless they are pulled down by a zero in register 300. A set of wires 475, shown as a single line for convenience, controls circuit 450 to apply a controllable bias to each of electrodes 150. A simple interface that may readily adapted by those skilled in the art is shown as subcircuit 360 of FIG. 4, in which a pair of transistors 362 and 363 are connected in series between line 475-9, the line in group 475 that controls electrode 159, and ground. An intermediate node 364 is connected to electrode !59 and controlled by transistor 365 that, in turn, is controlled by cell 359 of register 300. If line 475-9 is at a positive potential calculated to maintain node 364 at the blocking potential, and transistor 365 is a conventional N-channel FET, the application of a positive voltage to the gate will bring node 364 close to ground and a zero potential on the gate will allow node 364 to rise toward the voltage set by the ratio of transistors 362 and 363. Those skilled in the art will readily be able to modify the transistor polarity or bias level, etc, to accommodate their needs. It does not hurt if the shifting hardware within cell 359 temporarily shifts logic states during the transfer process so that electrode 159 shifts between the blocking potential and the release potential while control bits are shifted through cell 359, because there is no charge packet beneath it to be affected.

Those skilled in the art will readily be able to devise different embodiments of the system. For example, shift register 300 may be replaced with a conventional decoder, in which case the release operations may be performed by control 200 sending a sequentially increasing number to the decoder which, in turn, opens consecutively the right-most electrode 159 and then the others. A ROM or other PLA device could be used to respond to an input count or signal in a nonlinear fashion, so that a signal that is sampled at the uniform time interval of the SAW may be released with a variable time interval between samples. A dotted-line box labelled 310 is added to represent a set of optional parallel registers and/or input/output ports that may be used with alternative embodiments of the invention. For purposes of this application, the term port is taken in a general sense, including simple electrodes, as well as various kinds of latches and buffers. These registers, etc. are connected to various electrodes and terminals on the integrated circuit and to other parts of the control system. The path between source 50 and lines 240 within control 200 may be a direct connection, or the path may pass through a gate, either a linear gate for analog applications or a nonlinear gate for digital applications. In the former case, the connection is effectively outside controller 200. In the latter case, the connection may be controlled so that the sampling is selective. For example, the input signal could be sampled on the occurrence of some condition detected by some portion of a total system, with an irregular flow of samples into unit 100. Each sample would be trapped by the application of a blocking potential to the last unoccupied electrode at a time when the charge packet passes through. They can then be released at regular or irregular intervals.

As an additional example, if a complex signal is to be sampled at a higher rate during some portion of the total sampling period, the SAW can be run at multiple of the lowest desired sampling rate (e.g., 180 MHz, for a 90 MHz lowest rate). During periods of high interest, the signal is passed through and sampled at the full rate. During periods of less interest, the signal is gated through at only every second, third, etc. SAW peak, so that the sampling rate is a fraction of the maximum rate.

The sampling operation at electrode 110 is conventionally performed with a bias to put the device in a more linear range, so that a zero signal will be represented by a finite amount of charge. This charge is a simple offset that can be subtracted off as is convenient. When "empty" packets accumulate under an nth electrode, the offset amounts will accumulate there. This problem may be solved by accumulating the empty packets under the nth electrode and trapping the desired packet under the next free electrode toward the input terminal (the (n−1)th electrode in this case). The accumulated charge under the nth electrode will pass out through the output and be ignored by the next unit in line. The same logic that identified the desired packet to be trapped will pass a flag signal identifying the (n−1)th electrode as the one having a packet of interest and the preceding nth electrode as the one with the packet to be discarded.

Further, the device may be used to sum two or more consecutive charge packets. If the next device in line will store the released charge from electrode 120 for a period greater than the delay between consecutive SAW peaks, two or more electrodes may be switched to the release potential, so that their charge packets will be summed in the next unit. Also, summing may be performed within device 100 by holding the nth electrode at the blocking potential while the packets are trapped beneath it. In these cases, appropriate subtractions will be performed in the subsequent processing to adjust for the presence of 2 or more amounts of background charge instead of the usual one.

As an example, a set of optical quadrant detectors, in which a circular photodetector is divided into four quadrants, may be used for applications in which the differential signals are relevant, or in which the sum of all four quadrants is the relevant discriminant. With the summing feature, a set of detectors can be wired so that the four quadrants send their signals separately into HACT 100. When the sum of the four quadrants is relevant, the last tap electrode (159) can be held at the blocking potential while the signals from the four quadrants are summed beneath it as they are carried in by the SAW. The next electrode is held while the next four quadrants are summed, etc.

Figure 2:
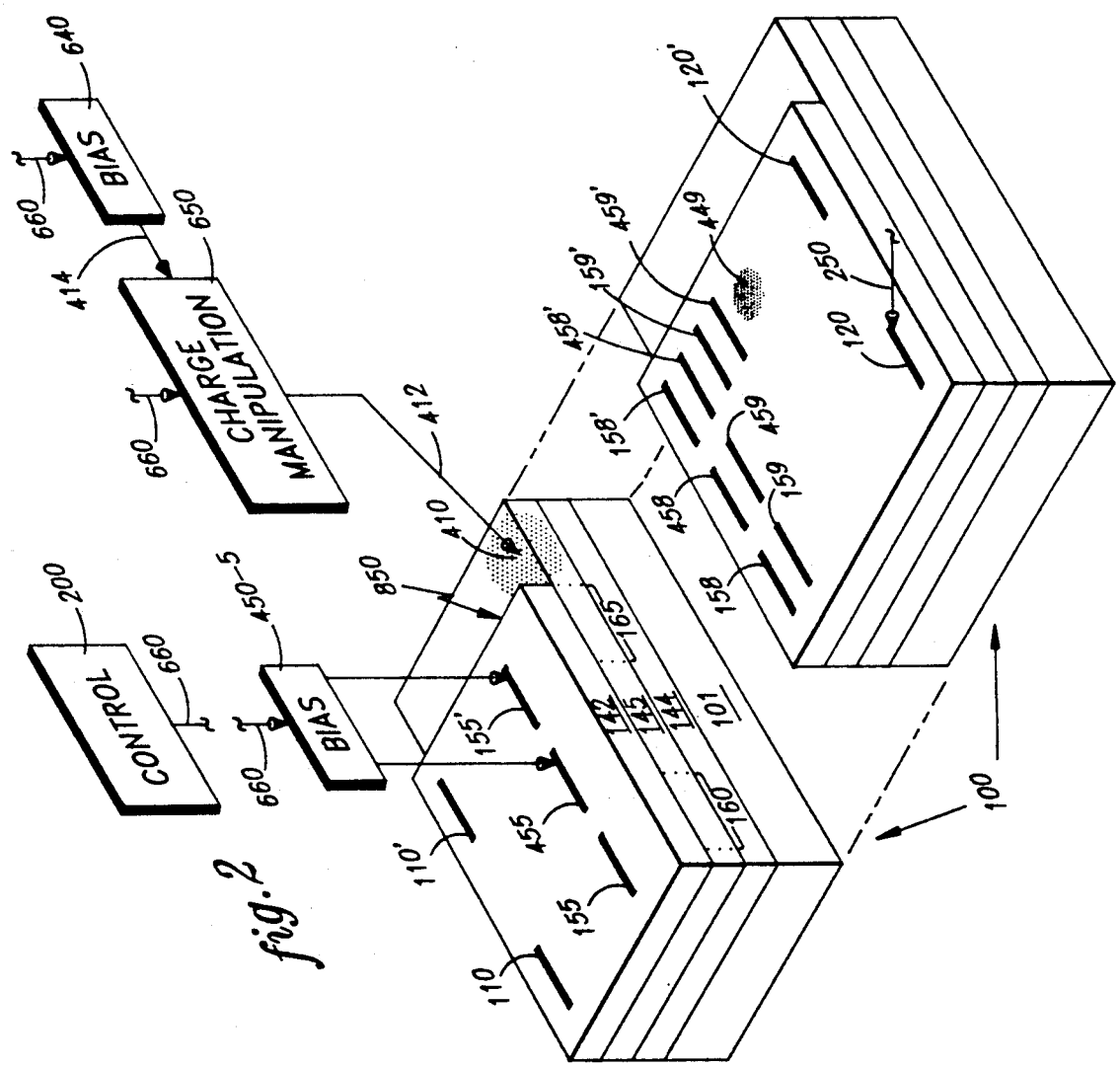
FIG. 2 illustrates in partially pictorial, partially schematic form, an embodiment of the invention.

Referring now to FIG. 2, there is illustrated an embodiment of the invention in which a HACT device 00 is shown having the same charge carrying channel 160 as before and, next to it, a second charge storage channel 165 having a counterpart electrode set 150'. Layers 142 and 144 are formed from AlGaAs to create a potential well for vertical confinement of charge in GaAs layer 145 as taught in the above-cited patent. Substrate 101 is a conventional GaAs wafer. Electrode 159 on the top surface is controlled as before by bias circuit 360 under control of controller 200, omitted from this drawing for simplicity. The function of channel 165 is to store the charge packet held under electrode 159 for signal processing on the magnitude of the sampled charge in the packet.

In operation, the storage process will proceed as before until the holding potential is applied. Then, a voltage will be applied to electrode 159' sufficiently greater in magnitude than that on 159 to cause charge to transfer between channels 160 and 165, as in a one stage charge coupled device (CCD). The connection between channel 160 and 165 and between charge storage area 165 and a charge manipulation circuit described below will be referred to as a charge path, meaning a semiconductor area through which charge may be attracted, as is conventional terminology. The charge is then held under electrode 159', since it has a potential greater in magnitude than the blocking potential. Bias circuit 450-5 is controlled by a line in control bus 660 from controller 200 to switch between a high voltage that attracts charge and ground or a negative voltage that will repel charge into channel 160. Counterpart bias circuits 450-1 to 450-9 are provided for the other charge storage electrodes. For typical HACT devices the blocking voltage on electrode 159 may be ~2 V and the voltage on electrode 159' may be ~3 V. Leaking between adjacent packets or out of channel 165 is subject to the same limits as channel 160. The charge in channel 165 is then processed as desired and the modified charge packet is transferred back to channel 160 and then passed on to output electrode 120 as before. Electrodes 159' and area 165-9 (the portion of channel 165 under electrode 159-) form the two plates of a charge storage capacitor 850 with the dielectric formed by layer 142. Layer 142 includes, as is conventional, an insulating cap layer that serves as the capacitor dielectric.

Bias circuit 450 may be controlled to select less than all of the charge packets, so that all but a desired subset of packets may be removed from the serial data stream. Alternatively, a first subset may be removed from the charge transport channel and the remainder of the packets may pass out the output electrode; the first subset may then be returned to the charge transport channel to pass out the output in turn. Those skilled in the art will readily appreciate that this method of operation is suited to deinterleaving serial data. This example also illustrates a "charge transfer means", which is a generic term referring to any sort of connection or connecting link. The charge path between the trapping area and the charge storage area is a charge transfer means between the two areas. The charge storage channel, the bias circuits and the charge path together comprise a charge transfer means connecting the charge transport channel at one time with itself at a later time—charge is transferred to the storage area and back.

In order to reduce charge leakage from the area under electrode 159', a variety of approaches may be taken. For processing times that are within the storage capability of the charge transport layer, no additional measures need be taken. If either the SAW or the steady state electron flow through channel 160 can be turned off without undue difficulty, the simplest approach is to bias electrode 159, after a charge packet has been transferred into channel 165, to a low potential that will prevent the leakage of electrons back into channel 160. If not, buffer electrodes 458, 459—(referred to collectively as electrodes 450) may be used for isolation. During the charge transfer operation, electrodes 159, 459 and 159' operate as a two-stage CCD to shift charge under electrode 159' under control of bias circuit 450. Electrode 459 is then lowered in potential to isolate the potential well under electrode 159' from channel 160. If desired, electrodes 450 could be replaced with pass transistors. That would be more expensive and take more area, but permits the partial merger of the charge manipulation circuit with the storage area as described below.

Additionally, guard electrodes 458' and 459' may be placed to the right of electrodes 158' and 159', respectively and maintained at a low potential to block migration of charge along channel 165.

Electrodes 459', etc may be replaced by or supplemented by ion implantation regions such as 449, shown to the right of electrode 159' created by implanting protons to the desired depth as is common practice sufficient to reduce the conductivity to a tolerable amount. Alternatively, region 449 may be a Schottky contact biased at ground or a negative voltage to prevent charge flow along channel 165. to discourage charge leakage.

At the right side of channel 165, a set of ohmic contacts 410 is formed in layer 145, one for each electrode of set 150' in channel 165. Charge will be drained out of or forced into channel 165 by means of auxiliary circuits as described below.

Figure 3A:
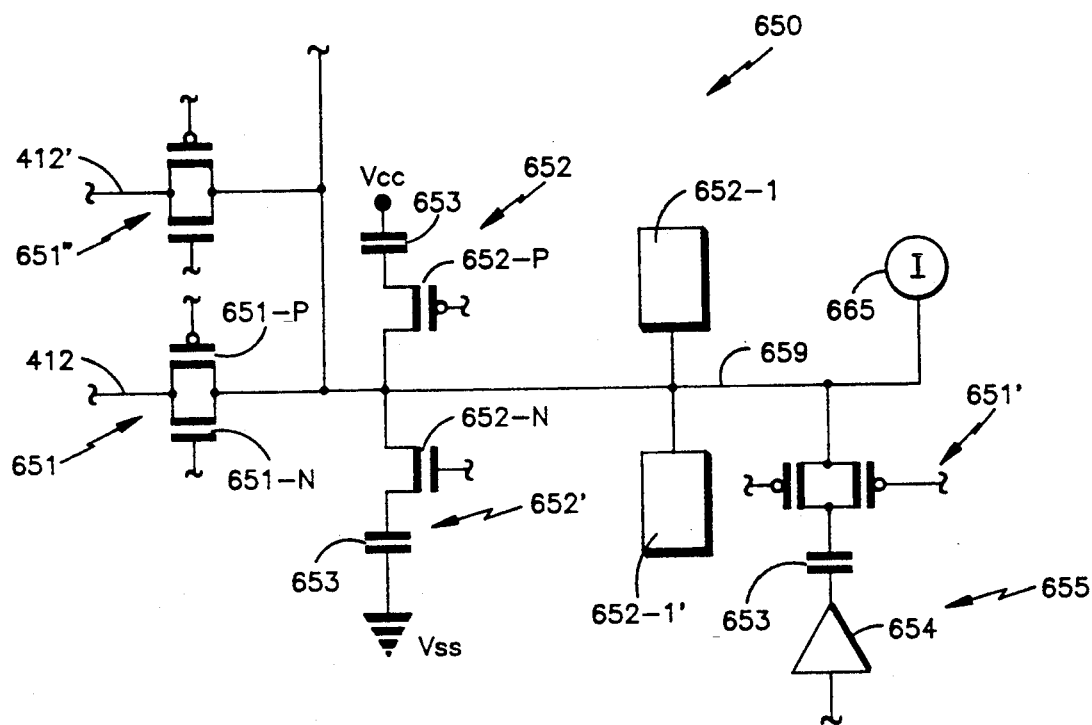
FIGS. 3a and 3b illustrate circuits for use with the embodiment of FIG. 2.
Figure 3B:
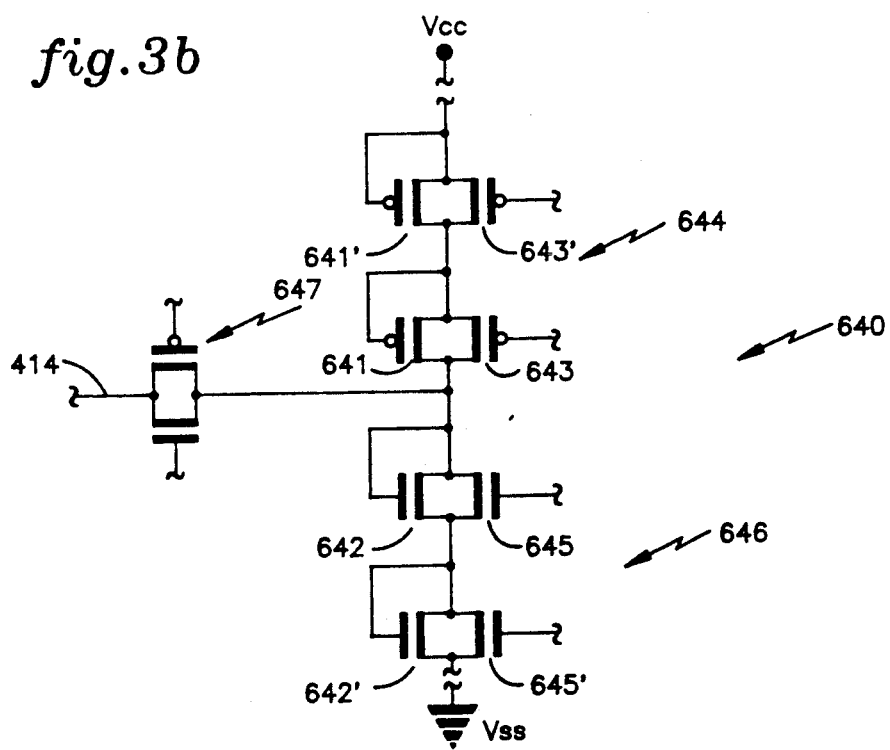

Circuit 650 in FIG. 3a is a charge manipulation circuit that will perform the charge manipulation by connecting capacitors or current sources to the charge storage capacitor 850 of FIG. 2. Node 659 will be brought in electrical contact with contact 410 of FIG. 2 through pass transistor 651 consisting of parallel P-channel and N channel transistors. A set of capacitor modules 652, 652', 652-1, 652-1' having capacitors 653 connected to ground or a positive voltage are connected to node 659 through corresponding coupling transistors 652-P or 652N. The capacitors may be arranged of different sizes on the binary sequence to establish a desired charge ratio with the charge in area 165-9. If the net capacitance in capacitors 850 and 653 is the same, and the capacitors 652 are initially uncharged, then the charge in 165-9 will be divided by two. If the ratio is N:1, the charge in 652-9 will be divided proportionately [1/(N+1)]. Transistors 651, 652-P, 652-N and their counterparts will be referred to as switches. An equivalent capacitor 860 formed from a set of the capacitor modules can thus be put in parallel with the charge storage capacitor 850, or be put as a series connection to ground. The capacitors will be referred to as being in parallel though their upper plates may be at different potentials because of variations between bias circuits.

Subcircuit 655 is an optional capacitor module that impresses either positive or negative voltage on the distant plate of capacitor 653 and uses dual pass transistor 651' to connect to node 659. This provides the option of positive or negative bias and an effective parallel or serial connection with half the capacitors and transistors of the version illustrated in the rest of the Figure.

In the parallel-connection case, selected switches in capacitor modules 652-n are closed and switches in capacitor modules 652-n' left open. The set of parallel connected capacitors form a composite capacitor 860 having node 659 in common and connected to the positive voltage Vcc. Since electrode 159' is connected to the positive voltage through bias circuit 360, the charge storage capacitor and the composite capacitor are connected in parallel from node 410-659 to the positive voltage. (Assuming without loss of generality that bias circuit 360 is set at the positive voltage, or that circuit 650 is biased at the same voltage as 360). The net capacitor formed by this parallel connection will have a capacitance to ground through the substrate of SAW device 100, but, since it is in common, it may be neglected without loss of generality.

A bias is maintained on node 659 by the effect of controllable bias circuit 640. As used herein, controllable applied to a circuit or component means that it has a terminal that is connected to controller 200 or some other control device, so that it can be controlled to assume one or another state. As used herein, controllably modifying a verb such as connected means that there is a switch or other device that is controllable, so that the connection can be made or broken. Node 659 may be maintained at a constant potential or may be varied in potential under control of controller 200 through a set of control lines schematically labelled 660 connected to the gates of the various transistors in circuit 640 and held at any desired potential, positive or negative. A chain of controllable P-channel and N-channel pull-up and pull-down transistors 641 and 642 is shown to control the value of node 659. The pull-up transistors (of selected current capacity) may be by-passed by transistors 643 or 645, etc under control of controller 200. Transistor 647 serves to isolate the bias circuit once the desired charge state is achieved.

In operation, pass transistor 651 and selected transistors 652-P or 652-N will be turned off while circuit 650 is pre-charged by circuit 640. Transistor 647 is then turned off and 651 turned on to connect the charge storage capacitor and the composite capacitor. Charge passes through pass transistor 651, having its gates connected to control lines 660 to divide between the charge storage capacitor 850 and the composite capacitor 860. The manner in which the charge will divide is readily calculated by those skilled in the art.

For example, suppose that it is desired to divide the charge in channel 165 by a factor of 2. The charge in channel 165 may be divided by connecting an initially uncharged capacitor of equal magnitude in parallel. This can be done with the circuit shown by isolating the capacitor modules in the lower half of circuit 650 and raising node 659 to the voltage of the power supply through circuit 640, assuming as before that electrode 159' is biased at the +5 volts of the power supply. During this time, pass transistor 651 is closed. The bias control circuit 640 is set to a high impedance state by turning transistor pair 647 off, leaving the composite capacitor uncharged and floating. When pass transistor 651 is opened, the charge in channel 165 is divided between two equal capacitors, connected in parallel between +5 volts and the effective node 410–659, so that the charge left in the channel will be half its original value. Once the charge has settled, pass transistors 651 may be turned off, leaving half the original charge in channel 165.

A similar result could be obtained by using the lower half of circuit 650, so that capacitor 850 would be in series with an equal capacitor in a chain extending from bias circuit 360 through capacitor 850 then through the composite capacitor in circuit 650 to ground, but the effect of capacitance between channel 65 and the substrate would present a more complex situation to be corrected for by calibration because there is an effective third capacitor that may be neglected when the parallel arrangement is used.

If the measurement is analog, there will be compensation for the residual capacitance of the transistors and connections between them, etc that can be avoided in a digital circuit. The need for this will depend on the layout and the accuracy required, of course.

The magnitude of the charge transfer may be adjusted by precharging capacitor modules 652, 652-1, etc. to tap off a greater or a lesser amount. It could be increased by precharging capacitors 653 and changing the bias on node 659 to a relatively low value during the precharge operation, so that charge flows in to the lower plates of capacitors 653. By this means, the charge in area 165-9 may be multiplied by a predetermined factor. The magnitude of the charge shift may be adjusted by changing the amount of capacitance exposed in circuit 650 or by repeating the operation. For example, the divide by 2 sequence may be continued, once channel 165 is isolated with half the original charge, by draining the composite capacitor and making the connection again, as often as desired. A fixed amount of charge may be added or subtracted to channel 165 by connecting a current source or sink 665 for a controlled time. For purposes of this application, the term current source will be taken to mean a source of both positive and negative current and the term addition will be taken to include the addition of both positive and negative quantities.

Once the charge in channel 165 has been adjusted as desired, pass transistor 651 can be turned off to freeze the charge in channel 165. The potentials on electrodes 159 and 459 are then changed to pull the charge packet back from channel 165 to channel 160, since this arrangement is electrically equivalent to a two stage CCD. The manipulated charge in storage area 165 may be held for a variable time (consistent with charge leakage or the use of refresh circuitry conventional in CCD's) and then returned to the SAW channel 160.

The charge manipulation process may be performed sequentially on each electrode in turn or in parallel, depending on a tradeoff between expense and complexity and the amount of time available before a packet must be passed out electrode 120 to the next device in the system. A second pass transistor 651" and line 412' illustrate a connection to a second storage area 165-8, say, that permits the use of one charge manipulation circuit with more than one charge storage area. Similarly, bias circuit 647 may be used with more than one charge manipulation circuit 650.

Figure 6A:
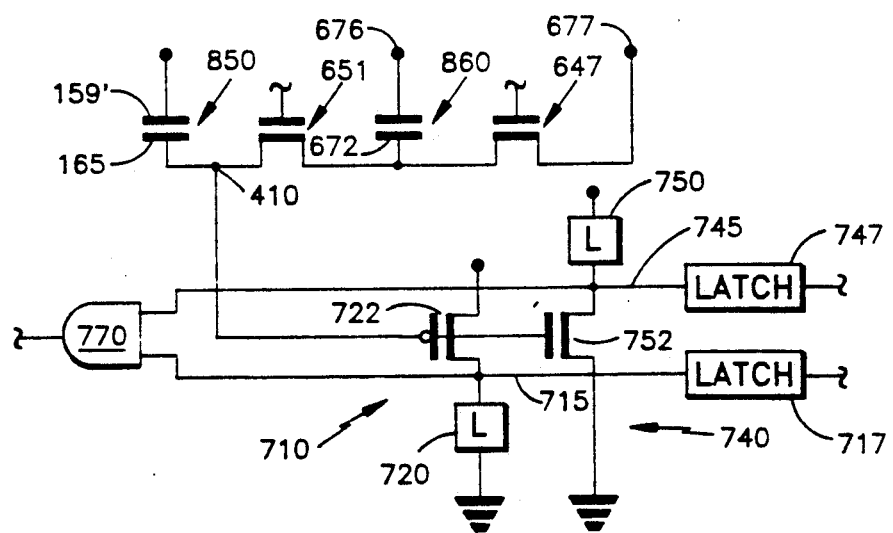
FIGS. 6a, 6b, and 6c illustrate in partially schematic, partially pictorial form an alternative embodiment of the invention.
Figure 6B:
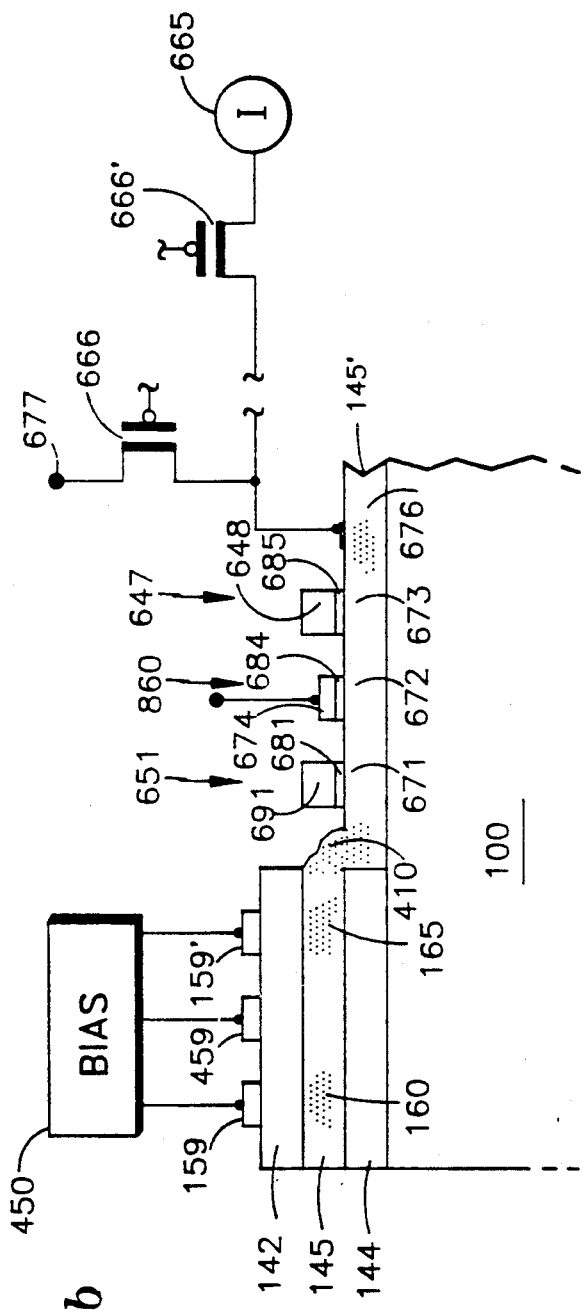
Figure 6C:
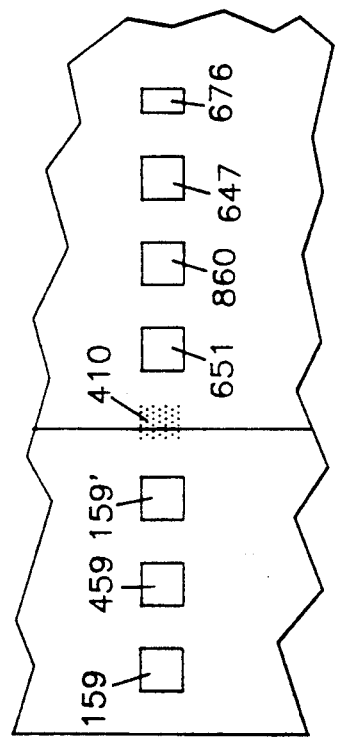

An alternative embodiment of the invention is illustrated schematically in FIG. 6a, in partially pictorial, partially schematic cross section in 6b, and in layout form in FIG. 6c, in which the components are illustrated schematically as boxes in a line that defines the region through which charge will flow. The arrangement is a simplified parallel configuration in which capacitor 860 (having plate 674 and conventional dielectric (silicon dioxide or silicon nitride 684) is connected between the positive voltage terminal and the drain of pass transistor 651, the source of which is connected to channel 165. Transistor 647 provides a connection to the positive voltage (terminal 677 above ohmic area 676)) also, for use in the precharge operation. Optionally, current source 665 could be used with transistor 666'.

The layout may be seen in FIG. 6b, in which AlGaAs layer 142 has been placed over a portion of substrate 100. GaAs layer 145 extends over layer 144 and substrate 100, permitting the passage of charge. Since charge transport layer 145 permits the highly efficient transfer of charge through its length, there is no difficulty in moving the charge from channel 165 to circuit 650 and back. The source of transistor 651 (having gate 691 and gate insulator 681) is channel 165 and the drain is area 672, which is the lower plate of capacitor 860. The remainder of capacitor 860 is formed by electrode 674 and insulator 684. Additionally, transistor 647, with channel 673, gate 648 and gate insulator 685, is formed next to capacitor 860. Area 672 serves as the source of transistor 647, as well as the drain of transistor 651. An ohmic area 676 on the right of layer 145 serves to connect the drain of transistor 647 to voltage terminal 677 through transistor 666. Current source 665 may be used instead of terminal 677 if desired.

The portion of layer 142 on the right in the drawing is denoted 142' to indicate that this portion of the GaAs will ordinarily have doping and thickness, appropriate for the transistor technology being used, different from the charge transport portion of layer 142. Several methods of transistor formation are possible using ion implantation into the GaAs substrate or growing additional layers appropriate for the transistor type. Preferably, depletion transistors should be used because the capacitors can be fully drained by going to the full value of the supply voltage, but enhancement transistors could also be used with a smaller range of pre-charging, or by changing the bias levels to those that depletion transistors can reach. Transistor 651 is a depletion transistor with source (channel 165) P-doped as lightly as possible and drain (area 672) P-doped more heavily. The doping of drain 674 may be P+ and the channels 671 and 673 may be conventional N−. This drawing omits for simplicity any intermediate buffer layers of graded composition between the bulk material and the layers used for the channels and devices. Such layers are conventional and well known to those skilled in the art.

Figure 7A:
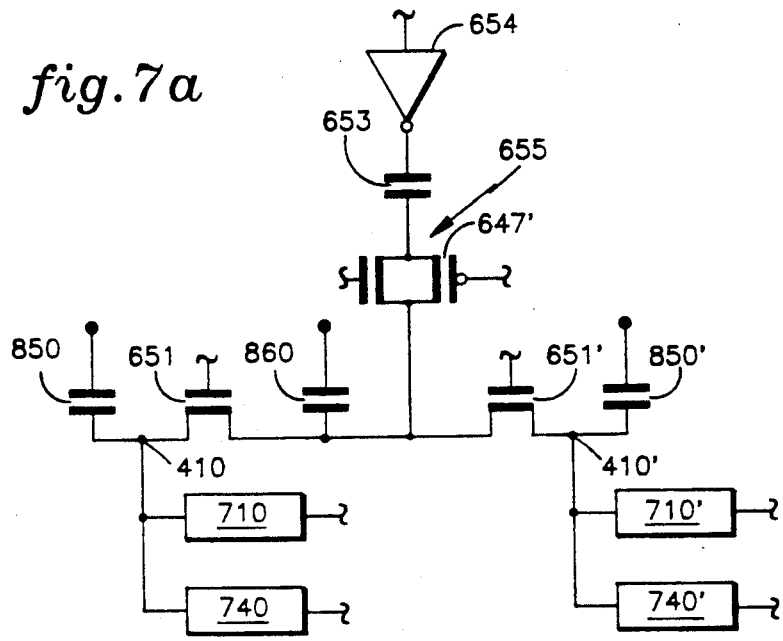
FIGS. 7a, 7b, and 7c illustrate in partially schematic, partially pictorial form an alternative embodiment of the invention.
Figure 7B:
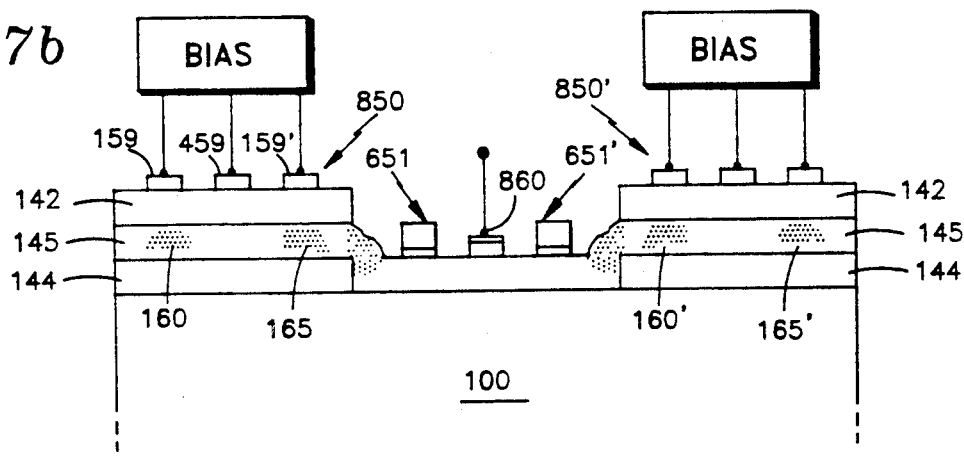
Figure 7C:
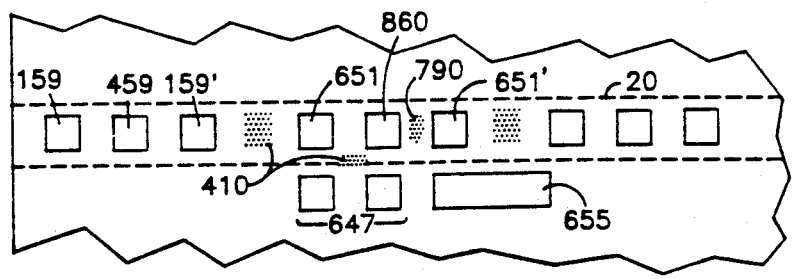

Referring now to FIG. 7, there is shown an alternative embodiment of the invention in which a second charge storage area 165' and second charge transport channel 160' are located symmetrically on the right side of FIG. 7b, with all the channels being within the area over which the SAW is effective, referred to as the transverse SAW distance. FIG. 7a illustrates the schematic, showing a second charge storage capacitor 850' and pass transistor 651'. The capacitor module 655 is used, having dual pass transistor 647', capacitor 653 and inverter 654. The layout is shown in FIG. 7c, with the main components in a line for charge transport and the pass transistor and inverter of the capacitor module displaced. Connection can be made from the capacitor module to the transverse charge transport path represented by dotted line 20 by an ohmic contact 790.

This version of the invention is a four-port device having first and second serial input ports and exit ports on the two charge transport channels. As discussed with reference to FIG. 6, more ports could be added by using the charge storage channels 165 and 165, to carry charge out to optional output electrodes. Thus there could be an additional two serial output ports. Data can enter in either input port, be transported into either charge storage area, manipulated in the common charge manipulation circuit and exit in either serial exit port. If desired, additional input electrodes be added to channels 165 and 165'. could As one example, data containing two or more timemultiplexed signals enter the left port. Charge packets are loaded into storage channel 165 and ANDed with a reference pattern stored in one of the registers 310 that is loaded into capacitors 860 by controlling transistors 647' with the data in register 310. There is thus a parallel input port for the device for the loading of reference or other data. Data, stored in channel 165 and originally from channel 160, that match the stored pattern are loaded back into channel 160 and exit. This is effected by controlling the bias circuit 450 with a pattern that depends on the outcome of the AND operation. Testing circuits 710 and 740 in FIG. 6a provide the result to controller 200, to be passed into circuit 450. Data that do not match may be loaded into channel 160' or 165'. If there are known to be only two sets of data present, this operation will accomplish the desired result. If there is noise, then the first comparison is made as before and another filter pattern may be loaded into the charge manipulation register formed by the ensemble of capacitor modules 655 and a second comparison made with the data that has failed the first test and were stored in channel 165'.

Additionally, as will be described in the discussion of digital operations, data may be transported out of the device in parallel by the use of a testing circuit to pass signals representative of the charge state of the storage area(s) to a parallel register in the collective register set 310. Ohmic contact 410 may also be used to pass data directly. Data may pass into the storage areas in parallel by the use of a register to control current sources to inject or drain charge. Thus, the invention may be used to perform parallel to serial conversion and vice versa, as is convenient in order to carry out a signal processing operation. In the embodiment illustrated, with both charge storage areas 165 and 165' used for transport, a serial signal enters on one input and some or all of it may exit on any of four outputs. The device may also perform the inverse function of combining signals from two or more inputs to a single output.

Figure 8A:
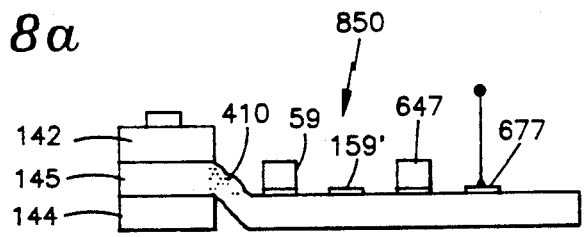
FIGS. 8a and 8b illustrates in partially schematic, FIG. 8, partially pictorial form a simplified alternative embodiment of the invention.
Figure 8B:
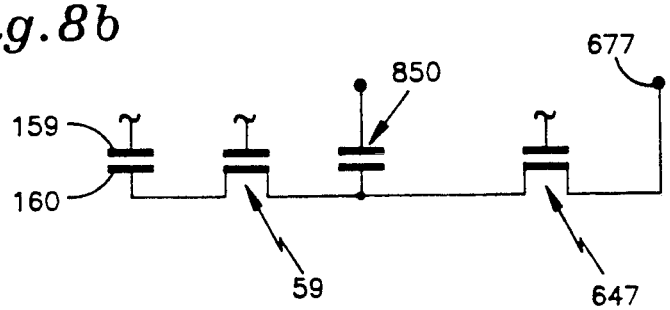

Referring now to FIGS. 8a and 8b, there is shown a simplified version of the invention, in which charge manipulation circuit 650 and bias circuit 640 have been reduced to capacitor 859, pass transistor 647 and electrode 677. This version is suitable for logic operations, with capacitor 850 being precharged from electrode 677, using pass transistor 647 for isolation. Terminal 677 may, of course, be connected to an inverter as described herein to add or subtract charge. Electrode 459 has been replaced by transistor 59. In operation, a charge packet in channel 160 may be operated on with the usual logic operations by turning pass transistor 59 on. The final charge may be passed out charge transport channel 160 to be detected by a discriminator or other level-sensing circuit; or optional circuits 710 and/or 740 may be added. The advantage of this embodiment is the reduction in space afforded by simplification, which may result in a beneficial tradeoff of cost and capability. Serial to parallel (and vice versa) operations may be performed by connecting registers to contact 410 or by loading data in through terminal 677.

In a simplified version, the charge manipulation circuit 650 is omitted and the device consists of four (or any number) channels in parallel. Charge enters any one of the channels serially; is blocked and some or all of the charge packets are transported through an N-stage transverse charge coupled device extending perpendicular to the plane of the paper by M stages. There is thus established a two-dimensional (N×M) device in which charge can be transported in two dimensions selectively to accomplish a multitude of signal processing functions. An alternative form of this embodiment is the use of one or more charge processing registers, consisting of one or more circuits 650 and 647 to process the charge being shifted.

Figure 9:
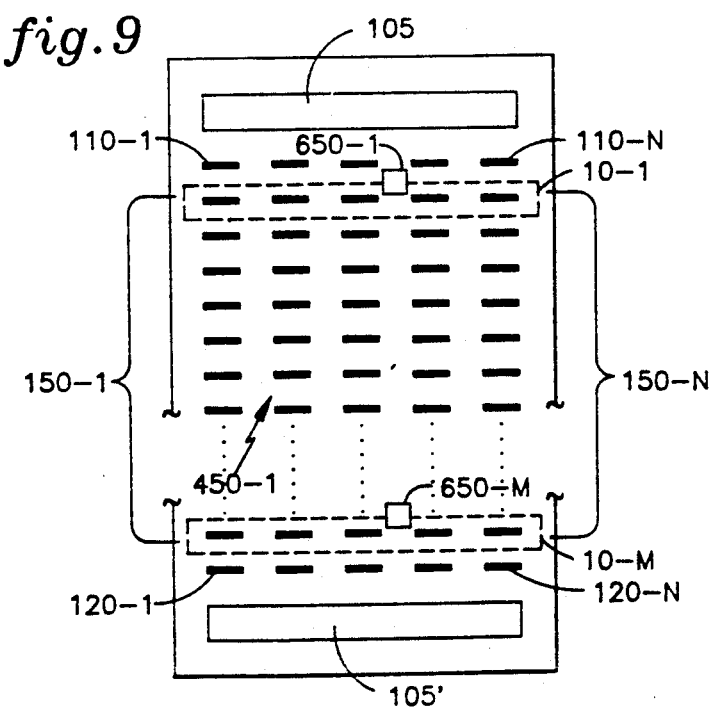
FIG. 9 illustrates a top view of an embodiment of the invention.

Referring now to FIG. 9, there is shown a top view of such an embodiment of the invention. SAW transducer 105 generates a SAW that travels downwardly in the Figure through a set of input electrodes 110-1 to 110-N and N sets of tap electrodes 150-1 to 150-N to a set of output electrodes 120-1 to 120-N. There are M stages in the tap electrode array and a corresponding M charge coupled registers 10-1 to 10-M, each comprising a horizontal set of tap electrodes and associated intermediate electrodes and denoted by a phantom line in the Figure. Only one set of intermediate electrodes, 450-1, is shown to avoid excessive crowding in the drawing. A charge manipulation register comprising a set of charge manipulation circuits 650-1 to 650-M (including circuit 640 in this Figure), is shown for performing one or more of the functions discussed above. Additional charge manipulation registers may be provided as desired. The boxes 650 are shown as overlapping charge coupled registers 10, which indicates a connection as shown in FIG. 7c, in which an ohmic contact 410 is formed at the edge of charge path 20. Those skilled in the art will readily appreciate the application of these two dimensional charge manipulation devices, which comprise a set of SAW charge transport channels overlapping a set of charge coupled devices. Charge packets move downwardly under the influence of the SAW from transducer 105 and may move upwardly by disabling transducer 105, enabling optional transducer 105' at the bottom of the Figure and reversing the roles of electrodes 110 and 120. Charge packets may move left and right under control of a controller manipulating the charge coupled devices.

As one function, the device can be used to convert time-multiplexed signals to spatially multiplexed signals travelling along different channels by sequentially applying filters to the input data. For example, a serial data stream carrying channels a, b, c, and d enters channel 165. After blocking, a first filter applied to the transfer electrodes 450' transfers data in channels c and d to the right into channel 165'. In the next cycle, data from channel a is transferred to the left into channel 160 by applying an appropriate signal set to electrodes 450 and, simultaneously, data from channel d is transferred from channel 165' to channel 160' by applying signals to the electrodes above channel 160'. At the end of this second operation, all four channels have been separated and the data then are carried by the SAW out along the channels. The inverse combination function can be performed by applying blocking voltages to the four channels to stop the serial data at predetermined locations so that channel a data is in location n, n+4, n+8, etc.; channel b data is in location n+1, n+5, etc., and so on for the other channels. The SAW velocity will be selected to provide the correct spacing to position consecutive channel packets four electrodes apart.

In digital applications, it may be of interest to perform logical operations on the data in channel 165. When there are no excess electrons in channel 165, it will be closest in voltage to the positive terminal and have a voltage V(0), denoting the voltage for zero charge. A corresponding V(Q) will be lower in magnitude and corresponding to the presence of the standard charge Q. The intermediate value V(Q/2) will be provided by splitting an initial charge Q. Plate 672 of capacitor 860 will have the same states. The following truth table shows the initial charge states and the result of bringing the plates in contact:

TABLE 1

| Initial Charge | | Result on Plate 165 |
|---|---|---|
| Plate 165 | Plate 672 | |
| Q | Q | V(Q) |
| Q | 0 | V(Q/2) |

TABLE 1-continued

| Initial Charge | | Result on Plate 165 |
|---|---|---|
| Plate 165 | Plate 672 | |
| O | Q | V(Q/2) |
| O | O | V(O) |

Thus, parallel logic operations may be performed with stored signals in register 310 that load a standard charge Q into capacitor 860 by connecting a current source to terminal 677 for a fixed time. An AND or an OR function can be realized by connecting a discriminator to electrode 120 with a threshold either between V(Q) and V(Q/2) for an AND function, or between V(Q/2) and V(0) for an OR function. Two discriminator circuits 710 and 740 are shown in FIG. 6a connected to terminal 410. The resulting charge could also be shifted back into channel 160 and passed out the normal path through electrode 120 to be analyzed by A/D 500 or another discriminator.

Illustratively, discriminator 710 consists of depletion transistor 722 having a threshold between V(Q/2) and V(0), an output node 715 and a load 720. Discriminator 740 is similar with enhancement transistor 742 having a threshold between V(Q/2) and V(Q) and corresponding load 750 and output node 745. Node 715 carries an OR function and node 745 carries an AND function. Inverters may be used with corresponding thresholds, if desired. Those skilled in the art will appreciate that conventional bias and level-shifting circuits may be used to accommodate the use of standard transistor thresholds. For example, a level shifting circuit may be inserted with parameters such that V(Q/2) and V(Q) bracket the threshold of a standard enhancement transistor 742.

The signals on the output nodes 715 and 745 may be used in any convenient manner. The outputs from nodes 715 and/or 745 may be fed back into controller 200, register 300 and/or the set of parallel registers denoted in FIG. 1 by box 310. The signals may be passed through a parallel port to another device or may be "fed back" within the system. For example, the output from nodes 715 and 745 may be combined in an XOR circuit to generate the XOR output that is conventionally used in computer terminal and other video graphics applications. In that case, the length of the tap electrode array will correspond to the number of pixels in a line. The result of the XOR circuit is passed into a register within controller 200 and used to control current source 655 to restore the full charge Q and drain charge to the value for a logic zero in storage area 165 in accordance with the XOR result. The data in the reference register defined by the set of capacitors 860 may represent the cursor in a computer display terminal, for example.

Table II illustrates the states of nodes 715 and 745 for the three different charge states. Those skilled in the art will appreciate that an AND circuit connected with nodes 715 and 745 as input will produce the XOR of the charge states of the reference capacitor and the charge storage capacitor on its output terminal.

TABLE II

| Contact 410 | Node | |
|---|---|---|
| | 715 | 745 |
| V(Q) | H | L |
| V(Q/2) | H | H |
| V(O) | L | H |

Many desired signal processing applications may be performed by manipulation of the stored charge prior to readout. For example, it may be desirable to intercept an interrogating signal from an unidentified source which has the intent to determine the location or velocity of a vehicle carrying the inventive system. False "target" information may be transmitted by receiving the interrogating waveform and re-transmitting modulated version(s) of the waveform in order to confuse the interrogating source. In another example, it may be desirable to correct for distortions of a received waveform in communication systems, in order to restore signal fidelity prior to re-transmission.

Another application is that of a self-scaling circuit. Referring back to FIG. 1, there is shown an additional sensing electrode 149 before the first of electrodes 150. Discriminator 148 generates an output if one of the packets exceeds some threshold. If one of the charge packets that will be stored under electrodes 150 does exceed the threshold, then the blocking operation proceeds as before, but controller 200 sets in motion a sequence of actions described above that configure circuits 650 to scale all the charges in the blocked charge set under electrodes 150. As an example, all charges might be divided by 2, but any other factor may be used. A signal is sent on a control line to the next processing unit to inform it that scaling has taken place. Such a feature is useful when the next unit in the system is a digital to analog converter or other analog unit that operates better within some voltage range. The raw data may be scaled either up or down in magnitude in order to fit it to the requirements of the next unit.

Figure 5:
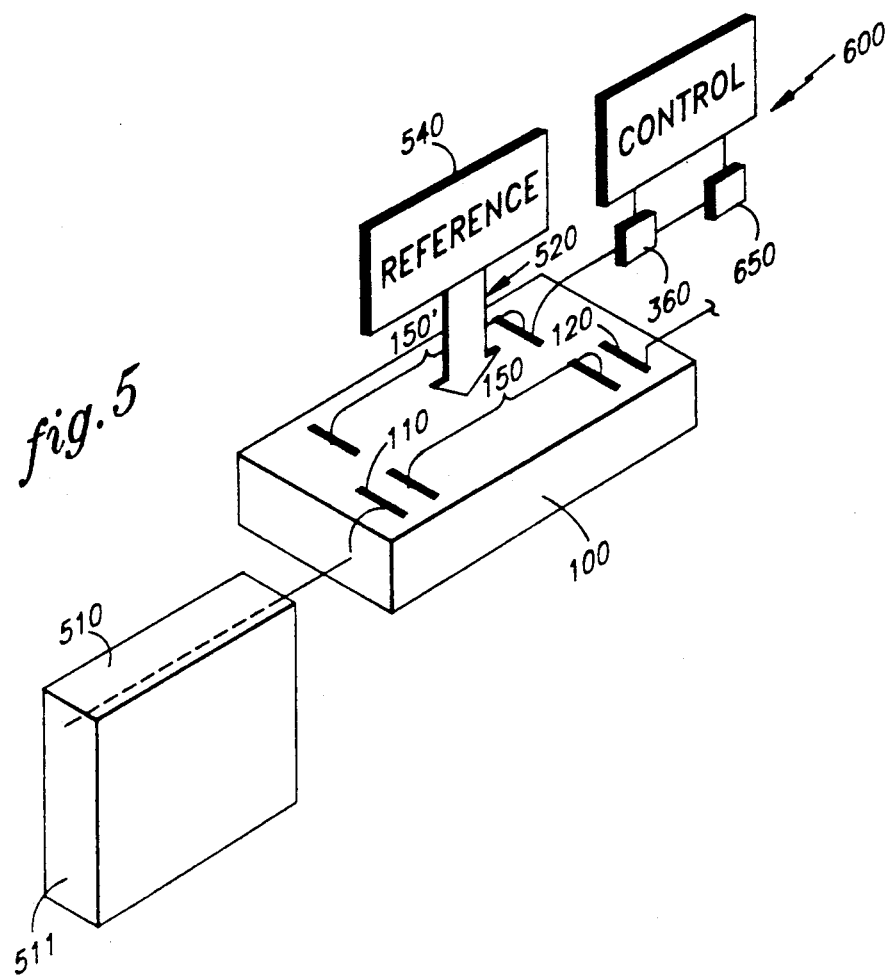
FIG. 5 illustrates a raster signal processing system employing the invention.

Another application is that of performing simple manipulation of raster data. The invention is well adapted to raster data, with the length of electrode set 150 being the same as a line and the interval between lines used to transfer charge out of channel 160. Referring now to FIG. 5, there is shown schematically a system in which raster data, which may be from a television, computer display terminal, vidicon tube, or radar system, is present in line 511 of raster source 510. This data may be an image of a workpiece in an industrial application, an image of an airplane in a radar scanning application or any other raster data that are to be correlated with reference data. The images referred to may be spatial images or the Fourier transforms of spatial images. Storage unit 540 holds reference data in the same format and scale that is to be compared with the input data. The image data is loaded into SAW device 100 and blocked in the same manner as described above. The blocked data is shifted from SAW channel 160 to channel 165 as before. Circuits 360 and 650 operate as before to apply in parallel a stored reference image to the data in channel 165. In the case of binary data, the capacitors in circuits 650 are precharged and biased as described above to perform AND and OR functions. For analog data, the comparison will also be analog and may result in a finer-grained comparison. The result of this simplified correlation may be returned to channel 160 and either passed through electrode 120 sequentially or it may be integrated by holding electrode 120 at the blocking potential and releasing the other electrodes, so that the charge packets stored under electrodes 151-159 accumulate under electrode 120. Finer-grained summation may also be performed by releasing 3 out of 4 electrodes, say, to accumulate under the fourth electrode and then passing the summed data sequentially to the next unit.

A particular application is that of color computer display terminals. The signals for the three primary colors are conventionally kept separate in a computer system, in "color planes". The embodiment of FIG. 7, with three sets of charge transport channels 160 and three sets of charge manipulation registers can be used to advantage in this application. A line of data passes through the three input channels in parallel; is manipulated simultaneously in the three charge manipulation registers, using the same or different stored data for the arithmetic or logic manipulation; is transferred back to the charge transport channels and passed out. In analog systems, one useful operation is draining charge representing input data and charging the relevant capacitor to a predetermined value so that the color of the relevant pixel is altered by changing the strength of the electron flow exciting that color phosphor.

It will be evident to those skilled in the art that the invention offers parallel arithmetic manipulation (addition, subtraction, multiplication, and division) of the data coming into the SAW device in a time that can be small compared to the processing times of individual units in the system. In the self-scaling embodiment, for example, the time required to tap off in parallel a fraction of the charge in all packets stored in channel 165, e.g. half, can be small compared to the operating time of an analog to digital converter.

Since register 300 has parallel load and unload hardware, there is a parallel input/output port to the device. Data such as a filter to use in selecting data to be transferred from channel 160 to channel 165 enters register 300. Other data can be loaded from the parallel port into the charge storage channel by controlling current source 665 as described above. Data may be extracted by using the testing circuit comprising one or more discriminators, XOR, etc. to pass signals that depend on the charge level out through the output port or by a direct connection to contact 410.

The invention thus can be used to make a fourport device having serial input and output ports and a parallel input and exit port (310 or 300). Applications include feeding in serial data, such as a video signal or time-multiplexed data; operating on the input by transferring all or a selected portion of it to the charge storage area; optionally processing the stored charge by division, multiplication, addition, subtraction, AND, OR, XOR; and passing the processed charge out a serial SAW channel or converting the processed charge to data that passes out a parallel port.

Charge storage channel 165 may be used as a second charge transport channel by the elimination of the optional implant areas that block charge leakage and the additional of an input and/or output electrode. If the storage potential on the charge storage electrodes 150' and the optional guard electrodes 450' is released, the SAW will carry the charge in channel 165 along to output electrode 120'. For example, bias circuit 450 could be controlled to apply selective bias to transfer only a portion of the data in channel 160 to channel 165. This could be used to demultiplex data or to deinterleave data in the presence of background noise. This combination is a three port device having one serial input port and two serial output ports.

Another simplification is the elimination of capacitor 860 and pass transistor 651. When the circuit in FIG. 8 is used, electrode 459 is replaced by transistor 59. The storage area and transistor 59 are both off layer 142. Capacitor 850 now gets charge directly from channel 160. With electrode 159 at a blocking potential of 5 volts, the charge will divide between the two capacitors 159-160 (the transport channel capacitor) and capacitor 850. If the capacitors are equal, division by two is accomplished. Pass transistor 647 and terminal 677 are used as before for precharging capacitor 850 when transistor 59 is turned off. If the voltage on electrode 159 is dropped to the lowest blocking voltage, the charge trapped beneath it will be attracted to capacitor 850 as before and channel 160 will be cleared as before. Logic operations may be effected by precharging capacitor 850 as capacitor 860 was charged before. The charge in channel 160 and in area 165 will divide, so the lower plate of capacitor 860 will have the values of Table 1. The same testing circuit shown in FIG. 6 may be used as before.

The different logical units shown in the drawing may be combined or separated in various fashions, well known to those skilled in the art. For example, a single-chip general purpose computer may perform the functions of units 200, 400 and 300. Similarly, the function of controlling the tap electrodes, bias circuits, charge manipulation circuits, etc. may be accomplished by a register as shown or by a modulation algorithm that releases the electrodes consecutively, in response to signals from controller 200. Such applications for varying the time between release of the sampled charge may be useful for modulating the signal time or phase of the input signal for intentional signal distortion. The input sampling may be controlled through timer 110 to select various portions of the input signal to be initially sampled. Since the sampling process is linear, the device is well suited to analog applications, but it can be used to advantage in digital applications as well. as many of the auxiliary circuits such as register 300 or bias circuits 450 or 360 as is convenient may be formed on the same substrate as the HACT device.

The device has been discussed with reference to a voltage terminal carrying +5 volts, but different magnitudes and polarities may also be used. The filter data may be variable or hard-wired. GaAs or other piezoelectric semiconductors could be used.

It should be understood that the invention is not limited to the particular embodiments shown and described herein, but that various changes and modifications may be made without departing from the spirit and scope of this novel concept as defined by the following claims.

What is claimed:

1. An integrated circuit signal processing device, having a semiconductor substrate and employing surface acoustic waves, comprising:

means for generating a SAW in a piezoelectric semiconductor structure having a charge transport layer, said SAW travelling in a predetermined direction from a SAW generator transducer along a charge transport channel in said charge transport layer;

an input electrode on a surface of said structure, for injecting electrons into said charge transport channel, so that electron packets are transported by said SAW through said charge transport channel from said input electrode to an output electrode;

a plurality of tap electrodes disposed above said charge transport channel between said input electrode and said output electrode; and means for applying a blocking potential to said tap electrodes at a predetermined potential value sufficient to trap said electron packets in proximity to corresponding tap electrodes in trapping areas in said charge transport channel corresponding to said tap electrodes, whereby a plurality of electron packets may be stored within said semiconductor structure, characterized in that:

said signal processing device further includes: at least one charge storage area disposed above said semiconductor substrate and connected to at least one corresponding trapping area in said charge transport channel by a transverse charge transport path;

a charge storage electrode on said surface above said at least one charge storage area; and controllable bias means for applying a bias to said charge storage electrode to move electrons between said charge transport channel and said charge storage area.

2. A device according to claim 1, further characterized in that at least one charge manipulation means for manipulating charge stored in said charge storage area is connected by a charge path to said charge storage area, whereby charge may be removed from said charge transport channel through said charge storage area to said charge manipulation means and manipulated.

3. A signal processing device according to claim 2, further characterized in that said charge storage electrode is controllably connected to a first voltage terminal having a first reference voltage level and forms with said charge storage area a charge storage capacitor connected between a common charge storage node and said first voltage terminal;

said charge manipulation means includes controllable charge pass switch means for controllably connecting said common charge storage node and a common manipulation node of said charge manipulation means; and said charge manipulation means further includes at least one charge manipulation capacitor connected between said common manipulation node and said first voltage terminal in parallel with said charge storage capacitor.

4. A signal processing device according to claim 3, further characterized in that:

a controllable bias circuit for biasing said common manipulation node at a predetermined bias level is connected to said common manipulation node.

5. A signal processing device according to claim 4, further characterized in that:

said controllable bias circuit includes means for connecting said common manipulation node to a voltage terminal having substantially said first reference voltage level, whereby said at least one charge manipulation capacitor may be substantially drained of charge by the connection of said common manipulation node to said first reference voltage level while said charge pass switch is open.

6. A signal processing device according to claim 1, further characterized in that:

a current source is controllably connected to said common charge storage node, whereby charge may be added to said common charge storage node.

7. A signal processing device according to claim 3, further characterized in that:

a current source is controllably connected to said common manipulation node, whereby charge may be added to a charge manipulation capacitor connected to said common manipulation node.

8. A signal processing device according to claim 5, further characterized in that:

a current source is controllably connected to said common manipulation node, whereby said at least one charge manipulation capacitor may be drained of charge and then pre-charged with a predetermined amount of charge.

9. A signal processing device according to claim 2, further characterized in that said charge storage electrode is connected to a first voltage terminal having a first reference voltage level and forms with said charge storage area a charge storage capacitor connected between a common charge storage node and said first voltage terminal;

said charge manipulation means includes charge pass switch means for controllably connecting said common charge storage node and a common manipulation node of said charge manipulation means; and said charge manipulation means further includes at least one charge manipulation capacitor connected by a first capacitor switch between said common manipulation node and a second voltage terminal, in series with said charge storage capacitor.

10. A signal processing device according to claim 9, further characterized in that:

a controllable bias circuit for biasing said common manipulation node at a predetermined bias level is connected to said common manipulation node.

11. A signal processing device according to claim 10, further characterized in that:

said controllable bias circuit includes means for connecting said common manipulation node to a voltage terminal having substantially a second reference voltage level, whereby said at least one charge manipulation capacitor may be substantially drained of charge by the connection of said common manipulation node to said second reference voltage level while said first capacitor switch is closed and said charge pass switch is open.

12. A signal processing device according to claim 3, further characterized in that:

a current source is connected to said common manipulation node, whereby charge may be added to a charge manipulation capacitor connected to said common manipulation node.

13. A signal processing device according to claim 12, further characterized in that:

a current source is connected to said common manipulation node, whereby said at least one charge manipulation capacitor may be drained of charge and then pre-charged with a predetermined amount of charge.

14. A signal processing device according to claim 5, further characterized in that:

said electron packets in said charge transport channel have one of at least two standard charge values, whereby an input charge in said charge storage area assumes one of said at least two standard values;

said at least one charge manipulation capacitor is precharged through said bias circuit with a reference charge having one of at least two standard reference charge values, whereby said common charge storage node and said charge manipulation node may each contain, after connection through said charge pass switch means, a predetermined final charge amount dependent on said input charge and said reference charge.

15. A signal processing device according to claim 14, further characterized in that:
said at least two standard values and said at least two reference charge values are two binary values, whereby said device performs a logic operation when said charge pass switch is opened to connect said common charge storage node and said common charge manipulation node.

16. A signal processing device according to claim 14, further characterized in that:
at least one testing circuit responsive to the amount of charge in said charge storage area and having a testing output terminal for carrying a signal representative of said final charge amount is connected to one of said charge storage area and said charge manipulation node.

17. A signal processing device according to claim 15, further characterized in that:
at least one binary testing circuit, responsive to the amount of charge in one of said charge storage area and said charge manipulation node and having a binary testing output terminal for carrying a signal representative of said final charge amount is connected to said charge storage area.

18. A signal processing device according to claim 17, further characterized in that:
said device includes means for charging said charge storage area with one of said two binary values of charge dependent on the state of said signal from said binary testing circuit representative of said final charge amount.

19. A signal processing device according to claim 18, further characterized in that:
said device includes means for connecting a current source to said charge storage area for charging said charge storage area with one of said two binary values of charge dependent on the state of said signal from said binary testing circuit representative of said final charge amount.

20. A signal processing device according to claim 17, further characterized in that:
said at least one testing circuit responsive to the amount of charge in said charge storage area has a discriminator threshold set to respond to the presence in one of said charge storage area and said charge manipulation node of an AND final charge amount corresponding to the presence in both said charge storage capacitor and said charge manipulation capacitor of a standard "logic one" charge, whereby said output terminal carries signals representing an AND function.

21. A signal processing device according to claim 17, further characterized in that:
said at least one testing circuit responsive to the amount of charge in said charge storage area has a discriminator threshold set to respond to the presence in one of said charge storage area and said charge manipulation node of an OR final charge amount corresponding to the presence in at least one of said charge storage capacitor and said charge manipulation capacitor of a standard "logic one" charge, whereby said output terminal carries signals representing an OR function.

22. A signal processing device according to claim 17, further characterized in that:
a first of said at least one testing circuit responsive to the amount of charge in said charge storage area has a discriminator threshold set to respond to the presence in one of said charge storage area and said charge manipulation node of an OR final charge amount corresponding to the presence in at least one of said charge storage capacitor and said charge manipulation capacitor of a standard "logic one" charge, whereby a first output terminal carries signals representing an OR function;
a second of said at least one testing circuit responsive to the amount of charge in said charge storage area has a discriminator threshold set to respond to the presence in one of said charge storage area and said charge manipulation node of an AND final charge amount corresponding to the presence in both said charge storage capacitor and said charge manipulation capacitor of a standard "logic one" charge, whereby a second output terminal carries signals representing an AND function; and
an AND circuit is connected to said first and said second output terminals, the output of which AND circuit carries an XOR function.

23. A signal processing device according to claim 2, further characterized in that said charge storage electrode is connected to a first voltage terminal having a first reference voltage level and forms with said charge storage area a charge storage capacitor connected between a common charge storage node and said first voltage terminal;
said charge manipulation means includes charge pass switch means for controllably connecting said common charge storage node and a common manipulation node of said charge manipulation means; and
said charge manipulation means further includes at least one charge manipulation capacitor connected by a first capacitor switch between said common manipulation node and said first voltage terminal in parallel with said charge storage capacitor.

24. A signal processing device according to claim 23, further characterized in that:
a controllable bias circuit for biasing said common manipulation node at a predetermined bias level is connected to said common manipulation node.

25. A signal processing device according to claim 24, further characterized in that:
said controllable bias circuit includes means for connecting said common manipulation node to a voltage terminal having substantially said first reference voltage level, whereby said at least one charge manipulation capacitor may be substantially drained of charge by the connection of said common manipulation node to said first reference voltage level while said first capacitor switch is closed and said charge pass switch is open.

26. A signal processing device according to claim 2, further characterized in that said charge storage electrode is connected to a first voltage terminal having a first reference voltage level and forms with said charge storage area a charge storage capacitor connected between a common charge storage node and said first voltage terminal;
said charge manipulation means includes charge pass switch means for controllably connecting said common charge storage node and a common manipulation node of said charge manipulation means; and said charge manipulation means further includes at least one charge manipulation module comprising a charge manipulation capacitor connected by a capacitor switch between said common manipulation node and an output terminal of a controllable inverter, whereby said charge manipulation capacitor is effectively connected in parallel with said charge storage capacitor when said output terminal of said controllable inverter is at said first reference voltage level and is effectively connected in series with said charge storage capacitor when said output terminal of said controllable inverter is at a second reference voltage level.

27. A signal processing device according to claim 26, further characterized in that:
a controllable bias circuit for biasing said common manipulation node at a predetermined bias level is connected to said common manipulation node.

28. A signal processing device according to claim 27, further characterized in that:
said controllable bias circuit includes means for connecting said common manipulation node to a voltage terminal having a corresponding reference voltage level substantially equal to the voltage on said output terminal of said inverter, whereby said at least one charge manipulation capacitor may be substantially drained of charge by the connection of said common manipulation node to said corresponding reference voltage level while said capacitor switch is closed and said charge pass switch is open.

29. A multi port integrated circuit signal processing device, having a semiconductor substrate and employing surface acoustic waves, comprising:
means for generating a SAW in a piezoelectric - semiconductor structure having a charge transport layer, said SAW travelling in a predetermined direction from a SAW generator transducer along a first charge transport channel in said charge transport layer;
a first port comprising a first input electrode on a surface of said structure, for injecting electrons into said charge transport channel, so that electron packets are transported by said SAW through said charge transport channel from said input electrode to a second port comprising a first output electrode;
a first plurality of tap electrodes disposed above said charge transport channel between said input electrode and said output electrode; and
means for applying a blocking potential to said tap electrodes at a predetermined potential value sufficient to trap said electron packets in proximity to corresponding tap electrodes in trapping areas in said first charge transport channel corresponding to said tap electrodes, whereby a plurality of electron packets may be stored within said semiconductor structure, characterized in that said signal processing device further includes:
a charge storage channel in said charge transport layer, parallel to said first charge transport channel and offset by a first displacement in a first direction therefrom along a transverse axis and containing a plurality of charge storage areas connected to a plurality of corresponding trapping areas in said charge transport channel by a first plurality of transverse charge transport paths;
a plurality of charge storage electrodes on said surface above said plurality of charge storage areas, whereby selected electron packets may be moved between said charge storage channel and said charge transport channel by application of a bias to predetermined ones of said plurality of charge storage and tap electrodes.

30. A signal processing device according to claim 29, further characterized in that:
said SAW extends transversely from said charge transport channel by a transverse SAW distance;
said first displacement of said charge storage channel is less than said transverse SAW distance, whereby electron packets may move within said charge storage channel; and
a third port comprising an output electrode is disposed above said charge storage channel, whereby said signal processing device comprises an input port and two output ports, each output port being related to said input port by a predetermined variable transfer function.

31. A signal processing device according to claim 29, further characterized in that:
said SAW extends transversely from said charge transport channel by a transverse SAW distance;
said first displacement of said charge storage channel is less than said transverse SAW distance; and
a fourth port comprises an input electrode connected to said charge storage channel, whereby electron packets may be carried by said SAW through said charge storage channel in said predetermined direction and said device is a four port device having two serial input ports and two serial output ports.

32. A signal processing device according to claim 29, further characterized in that:
a set of charge manipulation means are connected to said trapping areas.

33. A signal processing device according to claim 32, further characterized in that:
said set of charge manipulation means connected to said trapping areas include means for performing arithmetic operations on said electron packets.

34. A signal processing device according to claim 32, further characterized in that:
said set of charge manipulation means connected to said trapping areas for performing operations on said electron packets include means for converting an initial charge in a charge storage area to a remaining charge; and
a set of testing circuits responsive to said amount of remaining charge are connected to said charge storage areas for generating a signal on at least one testing circuit output terminal representative of the result of a logic operation between said initial charge and a reference charge stored in said charge manipulation means.

35. A signal processing device according to claim 31, further characterized in that:
a set of charge manipulation means are connected to said trapping areas.

36. A signal processing device according to claim 35, further characterized in that:
said set of charge manipulation means connected to said trapping areas include means for performing arithmetic operations on said electron packets.

37. A signal processing device according to claim 35, further characterized in that:

said set of charge manipulation means connected to said trapping areas for performing operations on said electron packets include means for converting an initial charge in a charge storage are to a remaining charge; and a set of testing circuits responsive to said amount of remaining charge are connected to said charge storage areas for generating a signal on at least one testing circuit output terminal representative of the result of a logic operation between said initial charge and a reference charge stored in said charge manipulation means.

38. A multi port integrated circuit signal processing device, having a semiconductor substrate and employing surface acoustic waves, comprising:

means for generating a SAW in a piezoelectric semiconductor structure having a charge transport layer, said SAW travelling in a predetermined direction from a SAW generator transducer along a first charge transport channel in said charge transport layer;

a first port comprising a first input electrode on a surface of said structure, for injecting electrons into said charge transport channel, so that electron packets are transported by said SAW through said charge transport channel from said input electrode to a second port comprising a first output electrode;

a first plurality of tap electrodes disposed above said charge transport channel between said input electrode and said output electrode; and means for applying a blocking potential to said tap electrodes at a predetermined potential value sufficient to trap said electron packets in proximity to corresponding tap electrodes in trapping areas in said first charge transport channel corresponding to said tap electrodes, whereby a plurality of electron packets may be stored within said semiconductor structure, characterized in that:

said signal processing device further includes:

a charge storage channel in said charge transport layer, parallel to said first charge transport channel and offset by a first displacement in a first direction therefrom along a transverse axis and containing a plurality of charge storage areas connected to a plurality of corresponding trapping areas in said charge transport channel by a first plurality of transverse charge transport paths;

a plurality of charge storage electrodes on said surface above said plurality of charge storage areas, whereby selected electron packets may be moved between said charge storage channel and said charge transport channel by application of a bias to predetermined ones of said plurality of charge storage and tap electrodes; and a third port comprising a set of electrodes connected by charge transfer means to said charge storage areas, whereby said signal processing device comprises two serial ports and a parallel port, said first port being related to said second port by a predetermined variable transfer function that is dependent on data applied to said parallel port.

39. A device according to claim 38, further characterized in that:

a set of controllable charge manipulation means are connected to said trapping areas, whereby said variable transfer function includes operations involving charge manipulation.

40. A signal processing device according to claim 39, further characterized in that:

said set of charge manipulation means connected to said trapping areas include means for performing arithmetic operations on said electron packets.

41. A signal processing device according to claim 39, further characterized in that:

said set of charge manipulation means connected to said trapping areas for performing operations on said electron packets include means for converting an initial charge in a charge storage area to a remaining charge; and a set of testing circuits responsive to said amount of remaining charge are connected to said charge storage areas for generating a signal on at least one testing circuit output terminal representative of the result of a logic operation between said initial charge and a reference charge stored in said charge manipulation means.

42. A signal processing device according to claim 41, further characterized in that:

control means for controlling a charge amount in said set of charge storage areas is connected to said testing circuit output terminal for placing a predetermined amount of charge in said charge storage areas in response to said signal on said at least one testing circuit output terminal, whereby data input through said serial input port are manipulated with stored data to produce a set of resultant data that are placed in said charge storage areas.

43. A multi port integrated circuit signal processing device for transferring input data from at least one input port to output data in at least one output port in accordance with a predetermined transfer function, comprising:

means for generating a SAW in a piezoelectric - semiconductor structure above a semiconductor substrate having a charge transport layer, said SAW travelling from a SAW generator transducer along a first charge transport channel in said charge transport layer in a predetermined direction along a longitudinal axis and extending transversely to said longitudinal axis by a SAW transverse distance;

a first input electrode on a surface of said structure, for injecting electrons into said first charge transport channel, whereby electron packets are transported by said SAW through said charge transport channel from said input electrode to an output electrode;

a first plurality of tap electrodes disposed above said first charge transport channel; and means for applying a blocking potential to said tap electrodes at a predetermined potential value sufficient to trap said electron packets in proximity to corresponding tap electrodes in trapping areas in said first charge transport channel corresponding to said tap electrodes, whereby a plurality of electron packets may be stored within said semiconductor structure, characterized in that said signal processing device further includes:

at least one charge coupled device manipulation register having a CCD path extending in a transverse direction along a transverse axis and overlapping a trapping area in said charge transport channel, said charge coupled device including at least one charge storage area and overlapping said trapping area in said charge transport channel, for transferring charge between said trapping area and said at least one charge storage area; and a first output electrode connected to one of said charge transport channel and said charge coupled device, whereby charge may transfer between said first input electrode and said first output electrode in accordance with a first predetermined transfer function.

44. A device according to claim 43, further characterized in that:
a plurality of charge coupled device manipulation registers are connected, parallel to said transverse axis, to said first charge transport channel, whereby charge packets may be transferred in parallel from a set of trapping areas through said plurality of charge coupled device manipulation registers in accordance with a predetermined parallel transfer function.

45. A device according to claim 44, further characterized in that:
a parallel data port is connected to said plurality of charge coupled device manipulation registers, for passing data representative of electron packets in said plurality of charge coupled device manipulation registers, whereby said device includes means for converting between serial and parallel data.

46. A device according to claim 44, further characterized in that:
a charge manipulation register, comprising a plurality of charge manipulation means for manipulating charge in a plurality of storage areas in said plurality of charge coupled device manipulation registers, is connected to at least two of said plurality of charge coupled device manipulation registers, whereby said device includes means for manipulating and transferring charge.

47. A device according to claim 45, further characterized in that:
a charge manipulation register, comprising a plurality of charge manipulation means for manipulating charge in a plurality of storage areas in said plurality of charge coupled device manipulation registers, is connected to at least two of said plurality of charge coupled device manipulation registers, whereby said device includes means for manipulating and transferring charge between a serial port and a parallel port connected to said charge manipulation register.

48. A device according to any of claims 44, 45, 46, or 47, further characterized in that:
at least two parallel charge transport channels are formed in said semiconductor substrate within said SAW transverse distance and connected to said plurality of charge coupled device manipulation registers, whereby charge packets may be transferred within a matrix of charge storage areas, individual storage areas within said matrix being connected by charge storage channels and charge paths.

49. A device according to claim 48, further characterized in that:
at least two of said parallel charge transport channels has a serial output port, whereby said device includes means for transferring charge from said first input electrode to at least one of said serial output ports through said plurality of charge coupled device manipulation registers in accordance with one of at least two serial-to-serial transfer functions.

50. An integrated circuit signal processing device, employing surface acoustic waves, comprising:
means for generating a SAW in a piezoelectric - semiconductor structure above a semiconductor substrate having a charge transport layer, said SAW travelling in a predetermined direction along a longitudinal axis and extending transversely to said longitudinal axis by a SAW transverse distance, from a SAW generator transducer along a first charge transport channel in said charge transport layer;

a first input electrode on a surface of said structure, for injecting electrons into said first charge transport channel, whereby electron packets are transported by said SAW through said charge transport channel from said input electrode to an output electrode in said first charge transport channel;

a first plurality of tap electrodes disposed above said first charge transport channel between said first input electrode and said first output electrode; and means for applying a blocking potential to said tap electrodes at a predetermined potential value sufficient to trap said electron packets in proximity to corresponding tap electrodes in trapping areas in said first charge transport channel corresponding to said tap electrodes, whereby a plurality of electron packets may be stored within said semiconductor structure, characterized in that said signal processing device further includes:

a charge storage channel in said charge transport layer, parallel to said first charge transport channel and offset by a first displacement in a first direction therefrom along a transverse axis and containing a plurality of charge storage areas connected to a plurality of corresponding trapping areas in said charge transport channel by a first plurality of transverse charge transport paths;

a plurality of charge storage electrodes on said surface above said plurality of charge storage areas;

a first controllable bias means for applying a bias to predetermined ones of said plurality of charge storage electrodes to move electrons between said charge transport channel and said charge storage area;

a second charge transport channel parallel to said first charge transport channel and displaced therefrom along said transverse axis and offset therefrom by a second displacement greater than said first displacement and within said SAW transverse distance, whereby said charge storage channel is disposed between said first and said second charge transport channels and said SAW travels along said second charge transport channel;

said plurality of charge storage areas are connected to a plurality of corresponding trapping areas in said second charge transport channel by a second plurality of transverse charge transport paths;

said second charge transport channel has a second plurality of tap electrodes disposed thereabove and a second output terminal; and second controllable bias means for applying a bias to predetermined ones of said plurality of charge storage electrodes to move electrons between said second charge transport channel and said charge storage area, whereby electrons may be moved from said first charge transport channel through said charge storage area to said second charge transport channel and vice versa.

51. A device according to claim 50, further characterized in that said second charge transport channel includes a second input electrode on said surface of said structure, for injecting electrons into said second charge transport channel, so that electron packets are transported by said SAW through said second charge transport channel from said second input electrode to said second output electrode in said second charge transport channel, whereby said device is a fourport device having two serial input ports at said first and second input electrodes and two serial exit ports at said first and second output electrodes, with a variable signal transfer function between one of said input and one of said output ports dependent on the operation of said first and second controllable bias means.

52. A device according to claim 50, further characterized in that:
at least two charge manipulation means are connected to predetermined ones of said plurality of charge storage areas for manipulating charge stored therein by an operation selected from the group consisting of addition, division, AND, and OR.

53. A device according to claim 51, further characterized in that:
a charge manipulation means is connected to each of said plurality of charge storage areas for manipulating charge stored therein by an operation selected from the group consisting of addition, division, AND, and OR.

54. A device according to claim 50, further characterized in that:
a set of parallel input means is connected to each of said plurality of charge storage areas for loading predetermined amounts of charge into said charge storage areas in parallel.

55. A device according to claim 51, further characterized in that:
a set of parallel input means is connected to each of said plurality of charge storage areas for loading predetermined amounts of charge into said charge storage areas in parallel.

56. A device according to claim 53, further characterized in that:
a charge manipulation means is connected to each of said plurality of charge storage areas for manipulating charge stored therein by an operation selected from the group consisting of addition, division, AND, and OR.

57. A device according to claim 54, further characterized in that:
a set of parallel input means is connected to each of said plurality of charge storage areas for loading predetermined amounts of charge into said charge storage areas in parallel.

58. An integrated circuit signal processing device, employing surface acoustic waves, comprising:
means for generating a SAW in a piezoelectric - semiconductor structure above a semiconductor substrate having a charge transport layer, said SAW travelling in a predetermined direction along a longitudinal axis and extending transversely to said longitudinal axis by a SAW transverse distance, from a SAW generator transducer along a first charge transport channel in said charge transport layer;
a first input electrode on a surface of said structure, for injecting electrons into said first charge transport channel, whereby electron packets are transported by said SAW through said charge transport channel from said input electrode to an output electrode in said first charge transport channel;
a first plurality of tap electrodes disposed above said first charge transport channel between said first input electrode and said first output electrode; and
means for applying a blocking potential to said tap electrodes at a predetermined potential value sufficient to trap said electron packets in proximity to corresponding tap electrodes in trapping areas in said first charge transport channel corresponding to said tap electrodes, whereby a plurality of electron packets may be stored within said semiconductor structure, characterized in that said signal processing device further includes:
a charge storage channel in said charge transport layer, parallel to said first charge transport channel and offset by a first displacement in a first direction therefrom along a transverse axis and containing a plurality of charge storage areas connected to a plurality of corresponding trapping areas in said charge transport channel by a first plurality of transverse charge transport paths, said charge storage areas forming the lower plate of a plurality of charge storage capacitors;
a plurality of charge storage electrodes on said surface above said plurality of charge storage areas, forming the upper plate of said plurality of charge storage capacitors;
a first controllable bias means for applying a bias to predetermined ones of said plurality of charge storage electrodes to move electrons between said trapping areas in said charge transport channel and said charge storage areas;
a plurality of isolation transistors having a first terminal comprising said trapping area, a second terminal comprising said charge storage area, and an isolation transistor control terminal connected to said controllable bias means; an
a plurality of terminal transistors connected between said plurality of charge storage capacitors and a plurality of ohmic terminals having first terminals comprising said charge storage areas, second terminals comprising said ohmic terminals, and a terminal transistor control terminal.

59. A device according to claim 58, further characterized in that:
a plurality of testing circuits are connected to said plurality of charge storage areas for comparing charge therein with a reference charge to generate a test output signal on a test output terminal dependent on a charge amount in said charge storage area.

60. A device according to claim 59, further characterized in that:
control means connected to said test output terminal controls at least one of said plurality of terminal transistors to impress on a corresponding charge storage area a charge state dependent on said test output signal.

61. An integrated circuit signal processing device, employing surface acoustic waves, comprising:
means for generating a SAW in a piezoelectric - semiconductor structure above a semiconductor substrate having a charge transport layer, said SAW travelling in a predetermined direction along a longitudinal axis and extending transversely to said longitudinal axis by a SAW transverse distance, from a SAW generator transducer along a first charge transport channel in said charge transport layer;

a first input electrode on a surface of said structure, for injecting electrons into said first charge transport channel, whereby electron packets are transported by said SAW through said charge transport channel from said input electrode to an output electrode in said first charge transport channel;

a first plurality of tap electrodes disposed above said first charge transport channel between said first input electrode and said first output electrode; and means for applying a blocking potential to said tap electrodes at a predetermined potential value sufficient to trap said electron packets in proximity to corresponding tap electrodes in trapping areas in said first charge transport channel corresponding to said tap electrodes, whereby a plurality of electron packets may be stored within said semiconductor structure, characterized in that said signal processing device further includes:

a charge storage channel in said charge transport layer, parallel to said first charge transport channel and offset by a first displacement in a first direction therefrom along a transverse axis and containing a plurality of charge storage areas connected to a plurality of corresponding trapping areas in said charge transport channel by a first plurality of transverse charge transport paths, said charge storage areas forming the lower plates of a plurality of charge storage capacitors;

a plurality of charge storage electrodes on said surface above said plurality of charge storage areas, forming the upper plates of said plurality of charge storage capacitors;

a first controllable bias means for applying a bias to predetermined ones of said plurality of charge storage electrodes to move electrons between said trapping areas in said charge transport channel and said charge storage areas;

a plurality of charge manipulation capacitors for manipulating charge in said charge storage areas;

a plurality of isolation transistors having a first terminal connected to said charge storage area, a second terminal comprising said the lower plate of said charge manipulation capacitor and an isolation transistor control terminal connected to said controller means;

a plurality of bias transistors connected between said plurality of charge manipulation capacitors and a plurality of ohmic terminals having first terminals comprising said lower plates of said charge manipulation capacitors, second terminals comprising said ohmic terminals, and a bias transistor control terminal; and bias circuit means for applying a predetermined bias to said ohmic terminals under control of said controller means.

62. A device according to claim 61, further characterized in that:

a plurality of testing circuits are connected to said plurality of charge storage areas for comparing charge therein with a reference charge to generate a test output signal on a test output terminal dependent on a charge amount in said charge storage area.

63. A device according to claim 62, further characterized in that:

control means connected to said test output terminal controls at least one of said plurality of terminal transistors to impress on a corresponding charge storage area a charge state dependent on said test output signal.

64. A method of processing serial data in a piezoelectric semiconductor structure comprising the steps of:

introducing serial data signals into a charge transport channel in said semiconductor structure through which a SAW is travelling, whereby said SAW carries charge packets of electrons representative of said serial data signals along said charge transport channel;

blocking said charge packets from further travel along said charge transport channel;

transferring selected charge packets to a charge storage channel parallel to said charge transport channel and storing said selected charge packets as a stored array of charge packets;

transferring selected charge packets from said stored array of charge packets to said charge transport channel as an output array of charge packets; and releasing selected ones of said output array of charge packets, whereby said SAW carries charge packets so released to an output electrode.

65. A method according to claim 64, including the further step of manipulating said stored array of charge packets in manipulation means connected to said charge storage channel.

66. A method according to claim 65, in which said stored array of charge packets are manipulated by arithmetic operations.

67. A method according to claim 66, in which each of said stored array of charge packets is divided by a predetermined factor to form a resultant stored array of charge packets.

68. A method according to claim 66, in which said stored array of charge packets are divided by a common factor to form a resultant stored array of charge packets.

69. A method according to claim 66, in which each of said stored array of charge packets is multiplied by a predetermined factor to form a resultant stored array of charge packets.

70. A method according to claim 66, in which said stored array of charge packets are multiplied by a common factor to form a resultant stored array of charge packets.

71. A method according to claim 66, in which each of said stored array of charge packets is reduced by a predetermined amount to form a resultant stored array of charge packets.

72. A method according to claim 66, in which said stored array of charge packets are reduced by a common amount to form a resultant stored array of charge packets.

73. A method according to claim 66, in which each of said stored array of charge packets is increased by a predetermined amount to form a resultant stored array of charge packets.

74. A method according to claim 66, in which said stored array of charge packets are increased by a common amount to form a resultant stored array of charge packets.

75. A method according to claim 65, in which a reference array of data are stored in reference storage means and said stored array of charge packets are manipulated by logic operations using said reference array and said stored array as inputs.

76. A method according to claim 65, in which at least one of said stored array of charge packets is compared in an AND operation with a reference amount of charge to form a resultant charge.

77. A method according to claim 65, in which at least one of said stored array of charge packets is compared in an OR operation with a reference amount of charge to form a resultant charge.

78. A method according to claim 76, in which said resultant charge in at least one of said charge storage areas is replaced with a standard charge having a magnitude dependent on said resultant charge.

79. A method according to claim 77, in which said resultant charge in at least one of said charge storage areas is replaced with a standard charge having a magnitude dependent on said resultant charge.

80. A method according to claim 64, in which said serial data signals contain first and second sets of data;
said first set of data is transferred to said charge storage channel;
said second set of data is released to travel to said output electrode;
said first set of data is transferred from said charge storage channel to said charge transport channel; and
said first set of data is released to travel to said output electrode.

81. A method according to claim 64, in which said serial data signals contain first and second sets of data and said charge storage channel and said change transport channel are both within said SAW, whereby charge packets may travel in both of said charge transport and charge storage channels;
said first set of data is transferred to said charge storage channel;
said first set of data is released to travel to an output electrode in contact with said charge storage channel; and
said second set of data is released to travel to said output electrode, whereby data is transferred from a first channel to a second channel.

82. A method of scaling serial data comprising the steps of:
introducing serial data signals into a charge transport channel in a piezoelectric semiconductor structure through which a SAW is travelling, whereby said SAW carries charge packets of electrons representative of said serial data signals along said charge transport channel;
comparing said serial data signals with a reference signals and generating a scaling flag when a data signal exceeds said reference signal in magnitude.
blocking said charge packets from further travel along said charge transport channel when said scaling flag is set;
transferring selected charge packets to a charge storage channel parallel to said charge transport channel and storing said selected charge packets as a stored array of charge packets;
dividing said stored array of charge packets by a predetermined factor;
transferring selected charge packets from said stored array of charge packets to said charge transport channel as an output array of charge packets; and
releasing selected ones of said output array of charge packets, whereby said SAW carries charge packets so released to an output electrode.

83. A method of transferring serial data from a first data stream in a piezoelectric semiconductor structure having a plurality of charge transport channels within a transverse SAW distance of a SAW wave travelling along a SAW axis to a second data stream comprising the steps of:
introducing serial data signals in a first data stream into a first charge transport channel in said semiconductor structure through which said SAW is travelling, whereby said SAW carries charge packets of electrons representative of said serial data signals along said first charge transport channel;
blocking said charge packets from further travel along said first charge transport channel; and
transferring selected charge packets selected from said first data stream to a second charge transport channel parallel to said first charge transport channel, leaving a remainder array of charge packets in said first data stream, and storing said selected charge packets as a stored array of charge packets, whereby said first data stream is separated into said stored array of charge packets and said remainder array of charge packets.

84. A signal processing system for processing raster data in an integrated circuit semiconductor substrate and employing surface acoustic waves, comprising:
means for generating a SAW in a piezoelectric - semiconductor structure having a charge transport layer, said SAW travelling in a predetermined direction from a SAW generator transducer along a charge transport channel in said charge transport layer;
an input electrode on a surface of said structure, for injecting electrons into said charge transport channel in response to a serial stream of data comprising a line of raster data, so that electron packets corresponding to said raster data are transported by said SAW through said charge transport channel from said input electrode to an output electrode;
a set of tap electrodes corresponding to said line of raster data, disposed above said charge transport channel between said input electrode and said output electrode; and
means for applying a blocking potential to said tap electrodes at a predetermined potential value sufficient to trap said electron packets in proximity to corresponding tap electrodes in trapping areas in said charge transport channel corresponding to said tap electrodes, whereby a raster line of electron packets may be stored within said semiconductor structure, in which said signal processing device further includes:
at least one charge storage area disposed above said semiconductor substrate and connected to at least one corresponding trapping area in said charge transport channel by a transverse charge transport path;
at least one charge storage electrode on said surface above said at least one charge storage area;
controllable bias means for applying a bias to said charge storage electrode to move electron packets between said charge transport channel and said charge storage area; and charge manipulation means, connected to said at least one charge storage area, for manipulating said electron packets, whereby said raster data may be processed in parallel in said charge manipulation means.

85. A system according to claim 84, in which a reference data pattern is loaded into said charge manipulation means and said raster data is compared with said reference data pattern.

86. A system according to claim 85, in which said reference data pattern is compared in an AND function to produce a resultant raster data set of electron packets.

87. A system according to claim 85, in which said resultant raster data set of electron packets are summed to form a pattern comparison resultant signal.

88. A system according to claim 85, in which said resultant raster data set of electron packets are first converted to standard binary packet magnitudes and then summed to form a pattern comparison resultant signal.

89. A system according to claim 85, in which said reference data pattern is compared in an XOR function to produce a resultant raster data set of electron packets.

90. A system according to claim 89, in which three parallel charge transport channels are formed, each of said charge transport channels being connected to charge manipulation means having a common reference data pattern; and said charge manipulation means performs simultaneously an XOR function on data in all three parallel charge transport channels.

91. A method of processing serial data in a piezoelectric semiconductor structure comprising the steps of:

introducing serial data signals through an input port into at least one charge transport channel in said semiconductor structure through which a SAW is travelling, whereby said SAW carries charge packets of electrons representative of said serial data signals along at least a first charge transport channel;

blocking said charge packets from further travel along said first charge transport channel; and releasing selected ones of said charge packets, whereby said SAW carries charge packets so released to an output port in accordance with a predetermined transfer function, characterized in that:

said predetermined transfer function is effected by transferring selected charge packets through a plurality of charge paths to a second charge transport channel parallel to said first charge transport channel and storing said selected charge packets as a stored array of charge packets; and releasing said stored array of charge packets to travel to said output port.

92. A method according to claim 91, further comprising the steps of:

manipulating said stored array of charge packets in accordance with a stored set of control signals;

transferring selected charge packets from said stored array of charge packets to form a resultant array of stored charge packets; and releasing said resultant array of stored charge packets to travel to said output port.

93. A method according to claim 92, further comprising the steps of:

transferring selected charge packets from said resultant array of charge packets to a selected one of said first and second charge transport channels as an output array of charge packets; and releasing said output array of stored charge packets to travel to said output port.

94. A method of processing serial data in a piezoelectric semiconductor structure according to claim 91, further comprising the steps of:

transferring said selected charge packets to said second charge transport channel in accordance with stored selection control data, whereby a set of remainder charge packets remains in said charge transport channel; and transferring selected output packets from said second charge transport channel to another one of said at least one charge transport channels and releasing said output packets.

95. A method of processing serial data in a piezoelectric semiconductor structure according to claim 94, further comprising the steps of:

transferring said selected charge packets from predetermined locations in a first charge transport channel to corresponding locations in a second charge transport channel, said corresponding locations being vacant and comprising less than the total of all locations in said second charge transport channel; and releasing electron packets in said corresponding locations and additional electron packets in other locations in said second charge transport channel, whereby said selected charge packets are combined in a serial data stream with said additional electron packets.

96. A method of processing serial data in a piezoelectric semiconductor structure according to claim 95, further comprising the steps of:

introducing a first set of serial data signals with a predetermined time interval therebetween such that a first set of corresponding electron packets are spaced along said first charge transport channel with a predetermined spacing distance;

introducing a second set of serial data signals in said second charge transport channel with said predetermined time interval therebetween such that a second set of corresponding electron packets are spaced along said second charge transport channel with said predetermined spacing distance and displaced along a common axis of said first and second charge transport channels from said first set of corresponding electron packets by a predetermined offset distance; and transferring said first set of electron packets from said first charge transport channel to said second charge transport channel, whereby said first and said second sets of electron packets are interleaved in said second charge transport channel; and releasing said first and second sets of electron packets to travel along said second charge transport channel to an output port in said second change transport channel.

97. A method of processing serial data in a piezoelectric semiconductor structure comprising the steps of:

introducing serial data signals through an input port into a first charge transport channel in said semiconductor structure through which a SAW is travelling along a transport axis, whereby said SAW carries charge packets of electrons representative of said serial data signals along said first charge transport channel;

applying a blocking potential to an nth electrode over said first charge transport channel to block said charge packets from further travel along said first charge transport channel;

applying said blocking potential to an (n−1)th electrode over said first charge transport channel, said (n−1)th electrode being disposed between said nth electrode and said input port, at a predetermined time to trap a selected electron packet; and releasing selected ones of said charge packets, whereby said SAW carries charge packets so released to an output port.

98. A method according to claim 97, further comprising the steps of:

repetitively applying said blocking potential to a series of nth electrodes and a series of (n−1)th electrodes in accordance with external control signals, whereby said electron packets are divided into a desired group trapped under the (n−1)th electrodes and an undesired group trapped under said nth electrodes.

99. A method according to claim 98, further comprising the steps of:

transferring said desired group from said first charge transport channel to a second charge transport channel parallel to said first charge transport channel 6 and connected thereto by a set of charge paths; and releasing said desired group to travel along said second charge transport channel to an output port connected to said second charge transport channel.

100. A method of processing serial data in a piezoelectric semiconductor structure comprising the steps of:

introducing serial data signals through an input port into a first charge transport channel in said semiconductor structure through which a SAW is travelling along a transport axis, whereby said SAW carries charge packets of electrons representative of said serial data signals along said first charge transport channel with a packet spacing interval; and applying a blocking potential to a set of summing electrodes positioned over said first charge transport channel with a summing electrode interval greater than said packet spacing interval to block said charge packets from further travel along said first charge transport channel, whereby charge packets travelling along said first charge transport channel are summed under said summing electrodes to form a set of summed packets.

101. A method according to claim 100, further comprising the steps of:

transferring said set of summed packets to a second charge transport channel parallel to said first charge transport channel and connected thereto by a set of charge paths; and releasing said set of summed packets to travel along said second charge transport channel to an output port connected to said second charge transport channel.

102. A method of processing serial data in a piezoelectric semiconductor structure comprising the steps of:

introducing serial data signals into a charge transport channel in said semiconductor structure through which a SAW is travelling, whereby said SAW carries charge packets of electrons representative of said serial data signals along said charge transport channel;

blocking said charge packets from further travel along said charge transport channel;

transferring selected charge packets to a charge storage channel parallel to said charge transport channel and storing said selected charge packets as a stored array of charge packets by application of said blocking potential to charge storage electrodes positioned over said second charge transport channel;

summing a subset of said stored array of charge packets by releasing selected ones of said stored array of charge packets to travel along said second charge transport channel until trapped and summed under a charge storage electrode having said blocking potential applied thereto to form an output array of summed packets; and releasing selected ones of said output array of charge packets, whereby said SAW carries charge packets so released to an output electrode.

* * * * *

UNITED STATES PATENT AND TRADEMARK OFFICE
CERTIFICATE OF CORRECTION

PATENT NO. : 5,107,310

DATED : April 21, 1992

INVENTOR(S) : Thomas W. Grudkowski et al

Page 1 of 2

Figure 4:
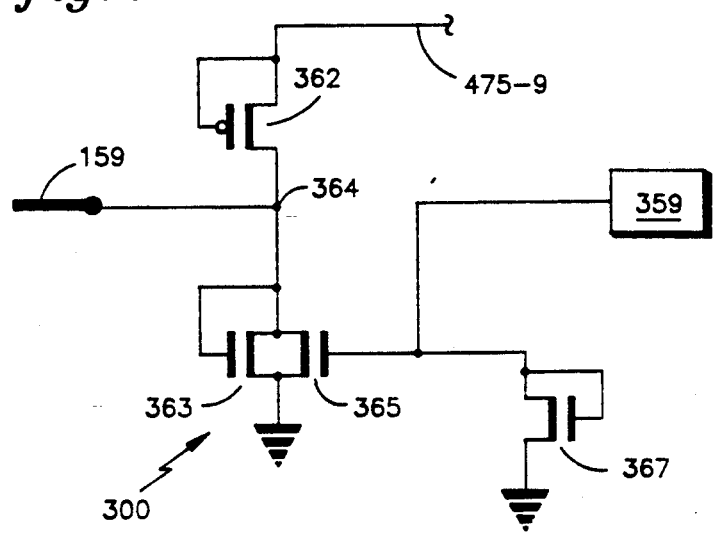
FIG. 4 illustrates a bias circuit for use with the invention.

It is certified that error appears in the above-indentified patent and that said Letters Patent is hereby corrected as shown below:

Delete Drawing Sheet 1, and substitute therefor the Drawing Sheets, consisting of FIGS. 1 and 4, as shown on the attached pages.

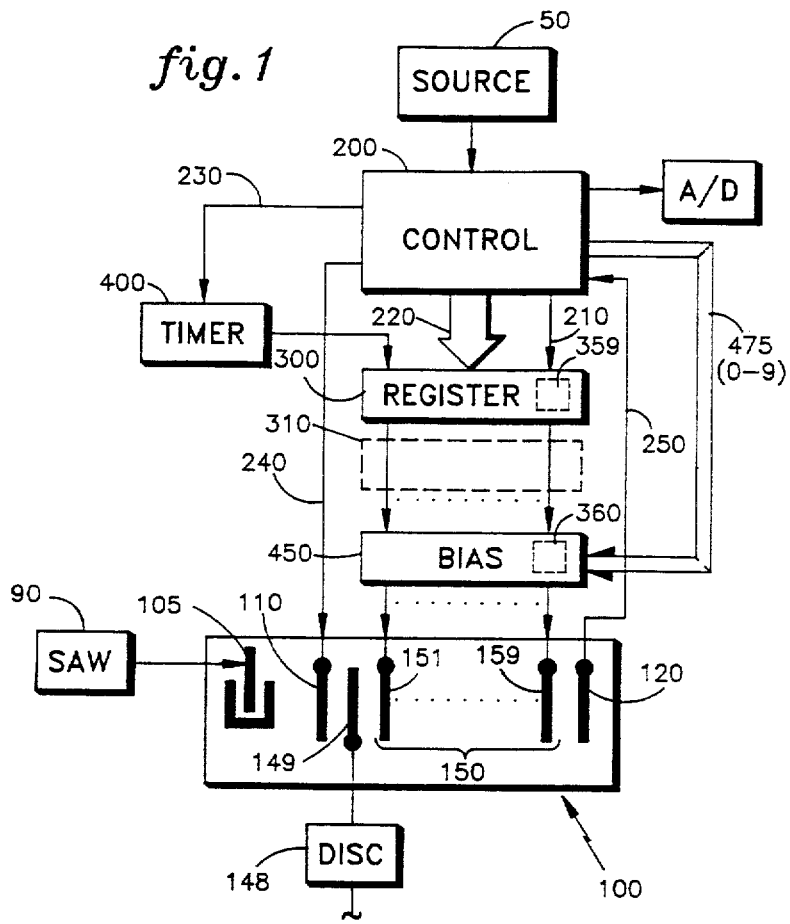

UNITED STATES PATENT AND TRADEMARK OFFICE
CERTIFICATE OF CORRECTION

PATENT NO. : 5,107,310

DATED : April 21, 1992

INVENTOR(S) : Thomas W. Grudkowski et al

It is certified that error appears in the above-identified patent and that said Letters Patent is hereby corrected as shown below:

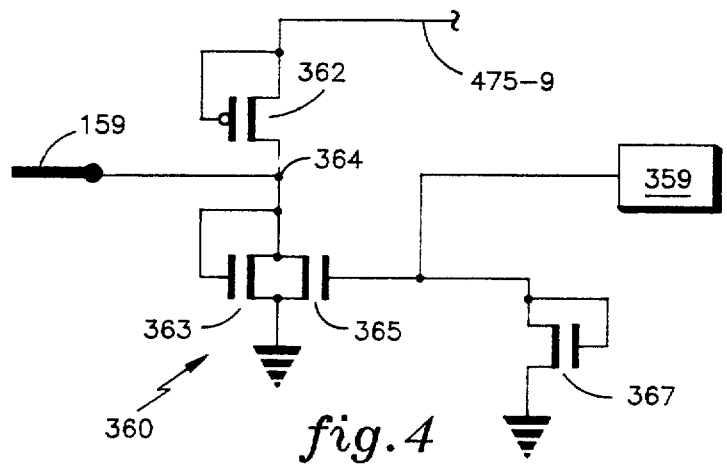

fig.4

Signed and Sealed this

Fourteenth Day of December, 1993

Attest:

BRUCE LEHMAN

Attesting Officer     Commissioner of Patents and Trademarks